(12) United States Patent
Crippa et al.

(10) Patent No.: US 10,365,299 B2
(45) Date of Patent: Jul. 30, 2019

(54) MANUFACTURING METHOD OF A SEMI-FINISHED PRODUCT COMPRISING A PLURALITY OF CONTACT PROBES FOR A TESTING HEAD OF ELECTRONIC DEVICES AND RELATED SEMI-FINISHED PRODUCT

(71) Applicant: Technoprobe S.p.A., Cernusco Lombardone (IT)

(72) Inventors: Giuseppe Crippa, Cernusco Lombardone (IT); Roberto Crippa, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 11 days.

(21) Appl. No.: 15/640,130

(22) Filed: Jun. 30, 2017

(65) Prior Publication Data
US 2017/0299634 A1    Oct. 19, 2017

Related U.S. Application Data

(63) Continuation-in-part of application No. PCT/EP2015/080419, filed on Dec. 18, 2015.

(30) Foreign Application Priority Data

Dec. 30, 2014 (IT) .............................. MI2014A2287

(51) Int. Cl.
*G01R 1/067* (2006.01)
*G01R 31/00* (2006.01)
(Continued)

(52) U.S. Cl.
CPC ............ *G01R 3/00* (2013.01); *G01R 1/06761* (2013.01); *G01R 1/07307* (2013.01); *G01R 1/07314* (2013.01)

(58) Field of Classification Search
CPC ............ G01R 1/07307; G01R 1/07342; G01R 31/00; G01R 31/327; G01R 31/333; G01N 27/42; G01N 31/02; H01H 1/0015
(Continued)

(56) References Cited

U.S. PATENT DOCUMENTS

| 2002/0075016 A1* | 6/2002 | Fjelstad | G01R 1/0491 |
| | | | 324/724 |
| 2003/0052703 A1* | 3/2003 | Terada | G01R 1/067 |
| | | | 324/756.03 |

(Continued)

FOREIGN PATENT DOCUMENTS

| JP | 2010-117268 A | † | 5/2010 | |
| JP | 2010117268 | * | 5/2010 | G01R 1/067 |

OTHER PUBLICATIONS

JP 2010-117268 machine translation, May 27, 2010.*

*Primary Examiner* — Giovanni Astacio-Oquendo
*Assistant Examiner* — Raul J Rios Russo
(74) *Attorney, Agent, or Firm* — Seed IP Law Group LLP

(57) ABSTRACT

A manufacturing method of a semi-finished product that includes a plurality of contact for a testing head of electronic devices comprises the steps of: providing a substrate made of a conductive material; and defining each contact probe by removing material from the substrate, each contact probes being anchored to the substrate by at least one bridge of material. The step of defining the contact probes includes a step of laser cutting, in correspondence with a contour of the contact probes and of that at least one bridge of material.

35 Claims, 20 Drawing Sheets

(51) Int. Cl.
*G01R 3/00* (2006.01)
*G01R 1/073* (2006.01)

(58) Field of Classification Search
USPC .... 324/71, 378, 403, 415, 425, 500, 755.01, 324/755.11
See application file for complete search history.

(56) References Cited

U.S. PATENT DOCUMENTS

| | | |
|---|---|---|
| 2003/0099097 A1* | 5/2003 | Mok .................. G01R 1/06716 361/767 |
| 2008/0105355 A1 | 5/2008 | Kumar et al. |
| 2012/0176122 A1† | 7/2012 | Hirata |
| 2013/0069683 A1 | 3/2013 | Kuo et al. |
| 2013/0227835 A1 | 9/2013 | Chiba et al. |
| 2014/0044985 A1† | 2/2014 | Kister |
| 2014/0197145 A1* | 7/2014 | Veeramani ............. B23K 26/18 219/121.72 |
| 2014/0347087 A1 | 11/2014 | Wirth et al. |
| 2017/0307656 A1* | 10/2017 | Vallauri .................... B44C 1/22 |

\* cited by examiner
† cited by third party

MANUFACTURING METHOD OF A SEMI-FINISHED PRODUCT COMPRISING A PLURALITY OF CONTACT PROBES FOR A TESTING HEAD OF ELECTRONIC DEVICES AND RELATED SEMI-FINISHED PRODUCT

BACKGROUND

Technical Field

In its more general aspect, the present disclosure refers to a manufacturing method of a semi-finished product including a plurality of contact probes for a testing head, the probes being realized in substrate of the semi-finished product and being anchored thereto and the following description is carried out with reference to this application field with the only purpose to simplify its exposition.

Description of the Related Art

As it is well known, a testing head (or probe head) is essentially a device suitable to place a plurality of contact pads of a microstructure, in particular an electronic device that is integrated on a wafer, into electrical contact with corresponding channels of a testing machine performing the working test thereof, particularly the electrical one, or generically the test.

The test, which is performed on integrated devices, is particularly useful to detect and isolate defective devices yet in the manufacturing step. Therefore, the testing heads usually are used to electrically test the devices that are integrated on a wafer before cutting (singling) and assembling them inside a chip package.

A testing head usually includes a high number of contact elements or contact probes made of special alloys having good mechanical and electrical properties and being provided with at least one contact portion for a corresponding plurality of contact pads of a device under test.

A testing head comprising vertical probes, which is usually called "vertical probe head", essentially includes a plurality of contact probes held by at least one pair of plates or guides, which are substantially plate-shaped and parallel to each other. Those guides are provided with specific holes and are arranged at a certain distance from each other in order to leave a free space or air gap for the movement and possible deformation of the contact probes. The pair of guides in particular include an upper guide and a lower guide, both provided with respective guide holes where the contact probes axially slide, the probes being usually made of special alloys having good electrical and mechanical properties.

The good connection between contact probes and contact pads of the device under test is guaranteed by pressing the testing head on the device itself, the contact probes, which are movable inside the guide holes made in the upper and lower guides, undergoing a bending inside the air gap between the two guides and a sliding inside those guiding holes during that pressing contact.

Moreover, the contact probes bending in the air gap can be assisted by means of a suitable configuration of the probes themselves or of their guides, as schematically shown in FIG. 1, where, for sake of illustration simplicity, only one contact probe of the plurality of probes usually included in a testing head has been depicted, the shown testing head being of the so-called shifted plates type.

In particular, in FIG. 1 a testing head 1 is schematically shown comprising at least one upper plate or guide 2 and one lower plate or guide 3, having respective upper guide hole 2A and lower guide hole 3A where the at least one contact probe 4 slides.

The contact probe 4 has at least one contact end or tip 4A. Here and in the following, the terms end or tip mean an end portion, not necessarily being sharp. In particular, the contact tip 4A abuts on a contact pad 5A of a device under test 5, realizing the electrical and mechanical contact between that device and a testing apparatus (not shown), the testing head 1 forming a terminal element thereof.

In some cases, the contact probes are fixedly fastened to the testing head at the upper guide: in such a case, the testing heads are referred to as blocked-probe testing heads.

Alternatively, testing heads are used having probes not fixedly fastened, but being interfaced to a board by means of a micro contact board: those testing heads are referred to as non-blocked probe testing heads. The micro contact board is usually called "space transformer" because, besides contacting the probes, it also allows spatially redistributing the contact pads made on it with respect to the contact pads of the device under test, in particular relaxing the distance constraints between the center of the pads themselves, namely with a space transformation in terms of distances between the adjacent pad centers.

In this case, as shown in FIG. 1, the contact probe 4 has a further contact tip 4B, which in this technical field is indicated as contact head, towards a plurality of contact pads 6A of that space transformer 6. The good electrical contact between probes and space transformer is guaranteed similarly to the contact with the device under test 5 by pressing the contact heads 4B of the contact probes 4 against the contact pads 6A of the space transformer 6.

As already explained, the upper 2 and lower 3 guides are suitably separated by an air gap 7 allowing the deformation of the contact probes 4 during the operation of the testing head 1 and guaranteeing that contact tip and contact head 4A and 4B of the contact probes 4 are contacting the contact pads 5A and 6A of the device under test 5 and space transformer 6, respectively. Clearly, the upper 2A and lower 3A guide holes must be sized in order to allow the contact probe 4 sliding therein.

It should be remembered that the proper operation of a testing head is essentially related to two parameters: the vertical movement, or overtravel, of the contact probes and the horizontal movement, or scrub, of the contact tips of those probes, where by "horizontal" it is meant a movement substantially coplanar to the device under test 5, and thus to the guides of the testing head 1, while by "vertical" it is meant a movement substantially orthogonal to the device under test 5 and to the guides of the testing head 1.

Therefore, these characteristics are to be evaluated and calibrated in the manufacturing step of the testing head, since the good electrical connection between probes and device under test should be always guaranteed.

It is also known to realize a contact probe 4 by means of a body 9A substantially extended in a longitudinal direction and made of a first conductive material, preferably a metal or a metal alloy, particularly a NiMn or NiCo alloy, as schematically shown in FIG. 2. Therefore, those contact probes 4 are arranged inside the testing head 1 with that longitudinal direction placed substantially vertically, i.e. perpendicularly to the device under test and to the guides.

The body 9A has a substantially central portion 8C having a preset length and two opposite ends or contact tips, precisely a contact end or contact tip 4A and a contact end or contact head 4B.

The contact tip 4A has a preset length 8A and it is intended to exert a pressing contact on a contact pad of a device under test (not shown, but anyway completely analogous to the contact pad 5A of the device under test 5 shown in FIG. 1) during the use of the contact probe 4.

Similarly, the contact head 4B in turn has a preset length 8B and instead it is intended to exert a pressing contact on a contact pad of a space transformer (not shown, but anyway completely analogous to the contact pad 6A of the space transformer 6 shown in FIG. 1), during the use of the contact probe 4, in particular in case of a non-blocked probe testing head.

As described for example in the Italian patent application No. MI2007A 002182 filed on 16 Nov. 2007 and granted on 23 Dec. 2010 with No. IT 1 383 883 on behalf of the same Applicant, it is known to coat the contact probe 4 with a layer 9B of a second conductive material, in particular having a hardness higher than that of the first conductive material realizing the body 9A. Preferably, the second conductive material is a metal or a metal alloy, in particular rhodium, gold, platinum or a palladium-cobalt PdCo alloy.

Moreover, as shown in FIG. 2, the central portion of the body 9A can be coated with a layer 9C too, in particular made of an insulating material, for example parylene.

In that way, the insulating coating realized by the layer 9C improves the electrical insulation of the contact probe 4 as a whole, avoiding short circuits in case of accidental contact between adjacent contact probes in the testing head 1.

The solution described in the above-mentioned Italian patent application in particular allows obtaining a greater hardness of the contact probe, at the same time guaranteeing the electrical insulation also in case of accidental contact with other adjacent contact probes.

However, that solution can reduce the electrical contact effectiveness between tips and heads of the contact probe and the respective contact pads.

In order to overcome that drawback, it is also known to coat the end portions of the contact probes, in particular at the contact tips and/or contact heads, using a highly conductive metal material, preferably gold.

Obviously, the involved dimensions as well as the cost of the involved materials make this coating operation extremely awkward.

Sometimes the contact probes are also subjected to common and often complex operations, the probes being placed and held to a dedicated support, which is usually called process frame. The probes held to the process frame then are subjected to one or more operations affecting them as a whole or at certain positions. Then, the contact probes should be removed from the process frame, in order to later proceed with their placement in a testing head.

Also in that case, the involved dimensions make the placing and holding operations of the contact probes to the process frame, and also their subsequent removal, complicated and expensive, especially in terms of manufacturing times and wastes.

US Patent Publication No. 2013/0069683 discloses a probe card manufacturing method wherein a plurality of contact probes is formed in a work-piece of a bulk conductive material by means of a reverse wire electrical discharge machining (R-WEDM) process. After the R-WEDM process, the contact probes remain attached to a common fabrication base, which is part of the original work-piece, and are then connected to a substrate. After the connection to the substrate, the fabrication base is then removed.

Moreover, US Patent Publication No. 2012/0176122 discloses a semi-finished product wherein contact probes are realized by filling with a metal material the opening of a mold that was previously realized by means of photolithographic techniques.

BRIEF SUMMARY

An embodiment of the present disclosure relates to a semi-finished product including a plurality of contact probes for a testing head, the probes being suitably realized in a substrate of that semi-finished product and being anchored thereto. Another embodiment is directed to a manufacturing method able to obtain such a semi-finished product, the method and the semi-finished product thereby obtained having such characteristics to allow realizing different operations on the plurality of contact probes in a simple, reliable and highly repeatable manner, in that way overcoming the limitations and drawbacks currently affecting the methods carried out according to the known art.

More in particular, according to an aspect of the disclosure, a semi-finished product can comprise many contact probes being obtained in a substrate of the semi-finished product by removing material from that substrate, the probes thereby realized having suitable mechanical connection bridges in order to hold the probes to the substrate, the semi-finished product thus being able to undergo one or more processing steps affecting all the probes being obtained therein, until obtaining contact probes having the desired characteristics, these probes then being able to be easily separated from the substrate of the semi-finished product.

According to another aspect of the disclosure, a manufacturing method of a semi-finished product comprising a plurality of contact probes for a testing head of electronic devices, can include the steps of:

providing a substrate made of a conductive material; and defining each contact probe by removing material from the substrate so that each contact probe turns out to be anchored to the substrate by at least one bridge of material, that step of defining the contact probes comprising a step of laser cutting, in correspondence with a contour of the contact probes and of the at least one bridge of material.

According to yet another aspect of the disclosure, the step of defining the contact probes can include a step of photolithographic etching by means of a masking process and subsequent chemical etching of the substrate, in turn optionally comprising one or more steps of masking and etching of the substrate or a step of selective chemical etching of the substrate.

In particular, the step of defining can realize the contact probes anchored to the substrate by a respective plurality of bridges of material, positioned in a totally random manner, symmetrically or asymmetrically, along each of that contact probes.

Moreover, according to another aspect of the disclosure, the step of defining can realize each of those contact probes comprising at least one first bridge of material positioned in a central position, preferably in correspondence of a first end portion comprising a contact tip of the contact probe and one second bridge of material positioned in a lateral position, preferably in correspondence of a second end portion comprising a contact head of the contact probe.

Furthermore, the step of defining can comprise a step of equipping each of those bridges of material with at least one line of weakening passing through it and adapted to facilitate the separation of the contact probe from the substrate with breakage of the integrity of the bridge of material, that at least one line of weakening being obtained by a local thinning of the substrate in its correspondence, according to a direction orthogonal to a plane of the semi-finished product.

According to another aspect of the disclosure, the step of providing the substrate can include one of the following steps of:

providing a monolayer made of a conductive material; or providing a multilayer, including a central layer or core made of a first conductive material covered by one or more coating layers made of conductive material and apt to improve the electro-mechanical performances and/or the performances in terms of hardness of the contact probes realized in the substrate.

Moreover, the manufacturing method can include at least one processing step, involving all the contact probes included in the semi-finished product, comprising one or more steps selected from a coating step, a covering step, a laser, photolithographic or electrochemical definition step, an electroplating step, an electrogalvanic deposition step, a micromechanical processing step, a sputtering step, a physical or chemical etching step.

In particular, the processing step can affect at least one portion of the contact probes or all the contact probes as a whole.

Moreover, the processing step can include multiple repeated steps of a same type for the same or different portions of the semi-finished product.

According to another aspect of the disclosure, the processing step can include in particular at least one coating step of the semi-finished product and thus of the contact probes or of portions thereof with realization of a coating film made of a coating material selected from a conductive material and a dielectric material.

In particular, the coating step can realize the coating film on at least one coated portion of the semi-finished product, that at least one coated portion being at an end portion of the semi-finished product, meaning a portion comprising contact tips or contact heads of the contact probes realized in the semi-finished product and/or that at least one coated portion being at a central portion of the semi-finished product, meaning a portion not comprising contact tips nor contact heads of the contact probes realized in the semi-finished product.

More in particular, the coating step can realize the coating film of a conductive material made of a metal or a metal alloy selected from palladium or alloys thereof, such as nickel-palladium, copper and alloys thereof, such as copper-niobium or copper-silver, rhodium and alloys thereof, silver or gold or alloys thereof or made of graphene, or yet made of doped DLC ("Diamond Like Carbon"), preferably selected from the group of noble metals group, more preferably gold.

Alternatively, the coating step can realize the coating film made of a dielectric material selected from fluorinated polymers, poly(p-xylylene) polymers, preferably Parylene®, in particular of the C type or of the F type, copolymers thereof or nanocomposites or non-doped DLC ("Diamond like Carbon"), preferably Parylene®, of the C type or of the F type.

According to yet another aspect of the disclosure, the coating step can be selected from:

immersion of the semi-finished product in a coating material in liquid phase in a tank of an immersion bath, the coating material in liquid phase filling the tank up to a coating level adapted to determine a portion of the semi-finished product coated by the coating film; or insertion of the semi-finished product in a vaporization chamber, equipped with one or more nozzles adapted to spray a coating material in vapor phase in correspondence of at least one portion of the semi-finished product to be coated by the coating film.

Furthermore, the coating step can include one or more steps of material deposition realized by means of a cathode sputtering process, wherein atoms, ions or molecular fragments are emitted by a solid material, called target, when bombarded with a beam of energetic particles and recondense on the surfaces of the semi-finished product, and therefore on the whole or part of the extension of the contact probes realized therein, when the semi-finished product is placed in a special vacuum chamber together with the target coating material suitably bombarded.

According to another aspect of the disclosure, the manufacturing method can further comprise a covering step by means of a dielectric covering material of at least one portion of the semi-finished product, so as to realize at least one covering film in a portion of the semi-finished product, preferably a portion corresponding to a central portion of the contact probes, meaning a portion not including the contact tips nor the contact heads.

Moreover, the covering step can include a total coating step of the contact probes with the covering material and subsequent masking of the semi-finished product and removal of the covering material outside a portion of interest of the contact probes realizing the covering film in that portion of interest.

Finally, the present disclosure also relates to a semi-finished product comprising a plurality of contact probes for a testing head, each of the contact probes being realized in a substrate of a conductive material and being anchored to the substrate by at least one bridge of material.

The characteristics and advantages of the semi-finished product and of the manufacturing method according to the disclosure will result from the following description of one embodiment thereof, given by way of an indicative and non-limiting example with reference to the attached drawings.

DETAILED DESCRIPTION

With reference to those figures, and particularly to FIGS. 3A-3B, 4A-4B and 5A-5B, a semi-finished product comprising a plurality of contact probes for a testing head is described, that semi-finished product being globally indicated with 15.

It should be noted that the figures represent schematic views and they are not drawn at scale, but instead are drawn so as to emphasize the important characteristics of the disclosure.

Moreover, the method steps described in the following do not form a complete process flow for the manufacturing of the semi-finished product and the contact probes. The present disclosure can be implemented together with the manufacturing techniques currently used in the field, and only those commonly used process steps that are necessary for the understanding of the present disclosure are included.

Figure 1:
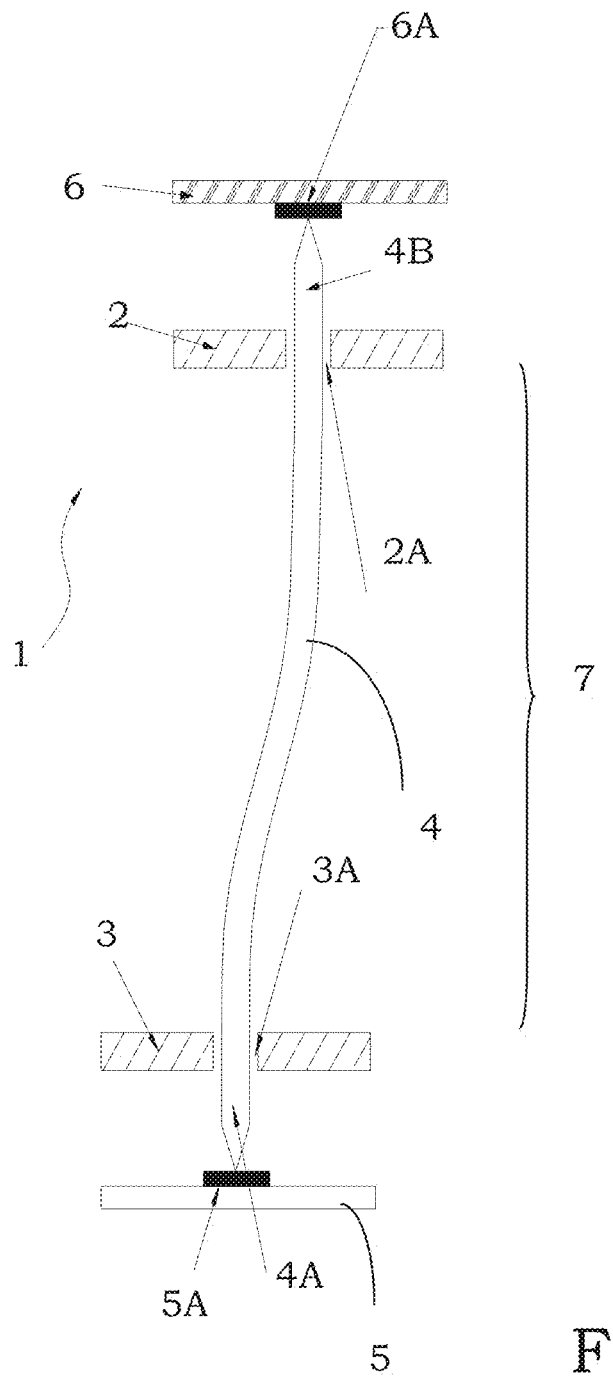
FIGS. 1 and 2 schematically show contact probes for a testing head being realized according to the prior art.
Figure 2:
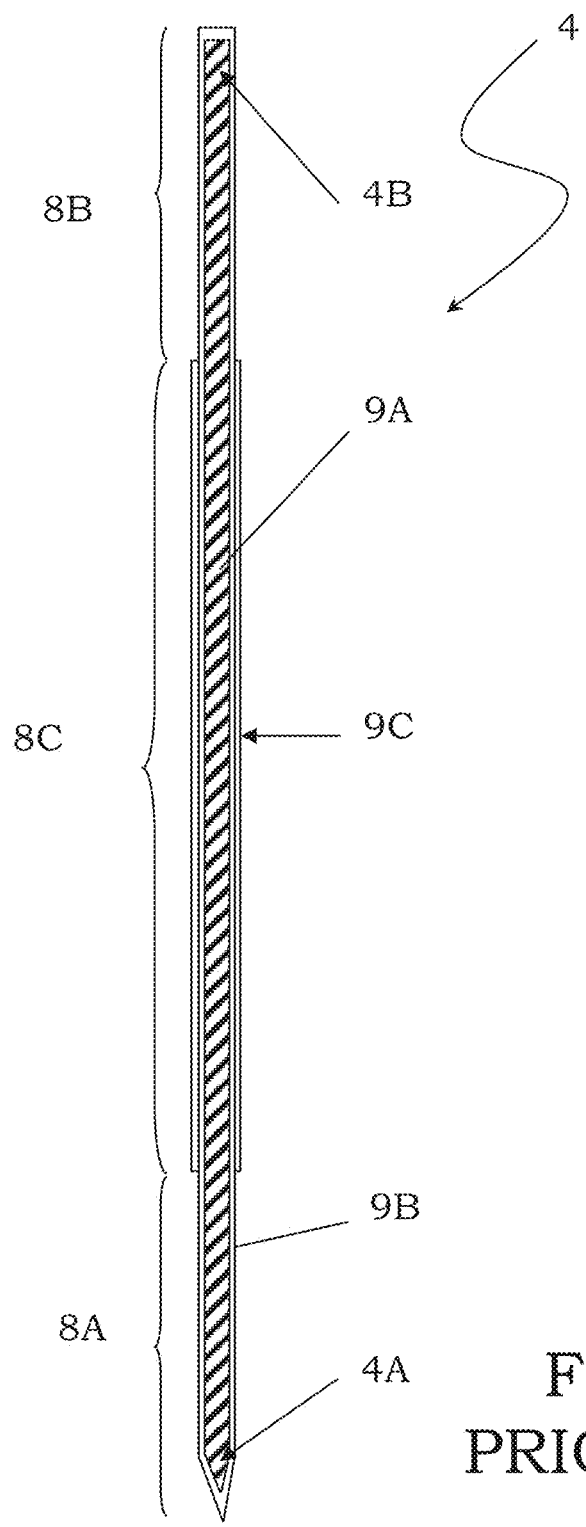
Figure 3A:
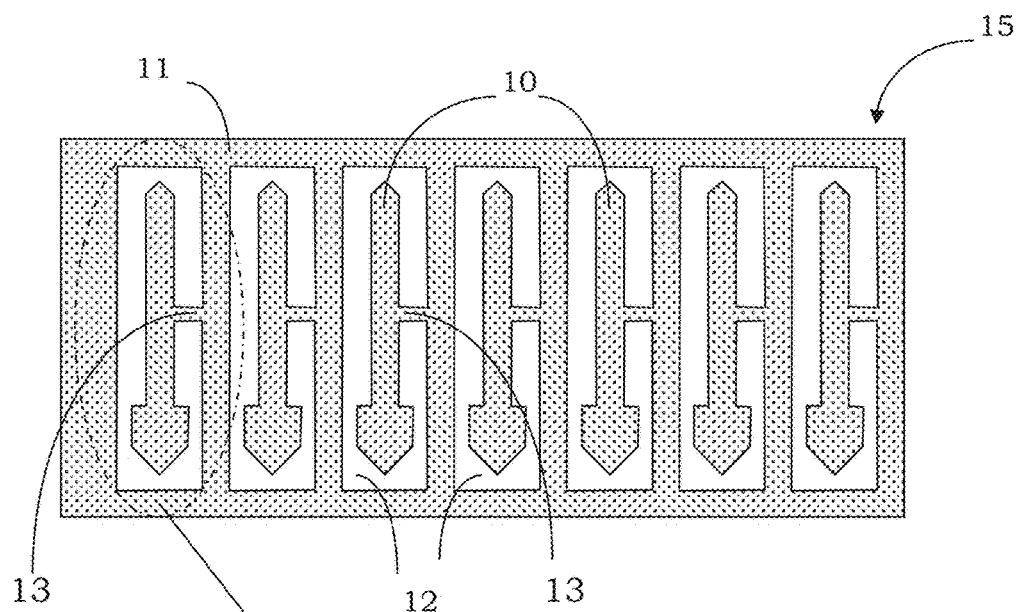
FIGS. 3A-3B, 4A-4B and 5A-5B schematically show alternative embodiments of a semi-finished product including a plurality of contact probes according to the present disclosure and corresponding details related to a single probe, respectively.

More in particular, as schematically shown in FIG. 3A, the semi-finished product 15 includes a plurality of contact probes 10 realized in a substrate 11 made of a conductive material.

Each contact probe 10 in particular is realized in a suitable recess that is substantially frame-shaped, simply indicated as frame 12, realized in the substrate 11 by removing material and apt to surround the contact probe 10.

Advantageously according to the present disclosure, each contact probe 10 is anchored to the substrate 11 by means of at least one material bridge 13.

Figure 3B:
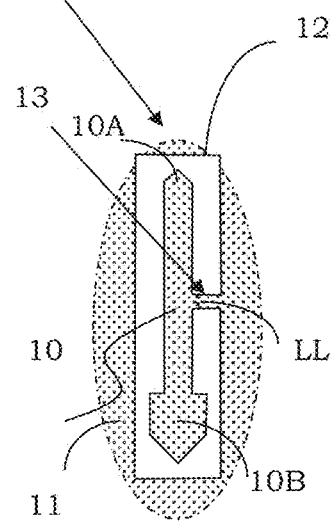

In particular, in the example shown in FIGS. 3A and 3B, each contact probe 10 has only one material bridge 13 connecting and anchoring it to the substrate 11 inside the corresponding frame 12, that material bridge 13 being realized at a probe portion, in a preferred embodiment a portion different from an end portion, the term end portion meaning a portion including the contact tip 10A or the contact head 10B of the contact probe 10.

Suitably, as shown in FIG. 3B, the material bridge 13 of each contact probe 10 is equipped with at least one weakening line LL passing through it and being adapted to facilitate the separation of the probe from the substrate 11 with breakage of the integrity of the material bridge 13.

In the embodiment shown in FIGS. 3A and 3B, each material bridge 13 has that weakening line LL placed near the contact probe 10, so that the breakage thereof when separating the contact probe 10 from the substrate 11 causes a retaining of most of the material bridge 13 anchored to the substrate 11.

Suitably, the weakening lines LL can be obtained by drilling the substrate 11 and that drilling can have any shape, for example circular, oval, rectangular, tilted, just to name some of them. Alternatively, according to a preferred embodiment of the semi-finished product 15 according to the present disclosure, the weakening lines LL can be obtained by a local thinning of the substrate 11 in their correspondence, according to a direction Z orthogonal to a plane of the semi-finished product 15 itself.

Figure 4A:
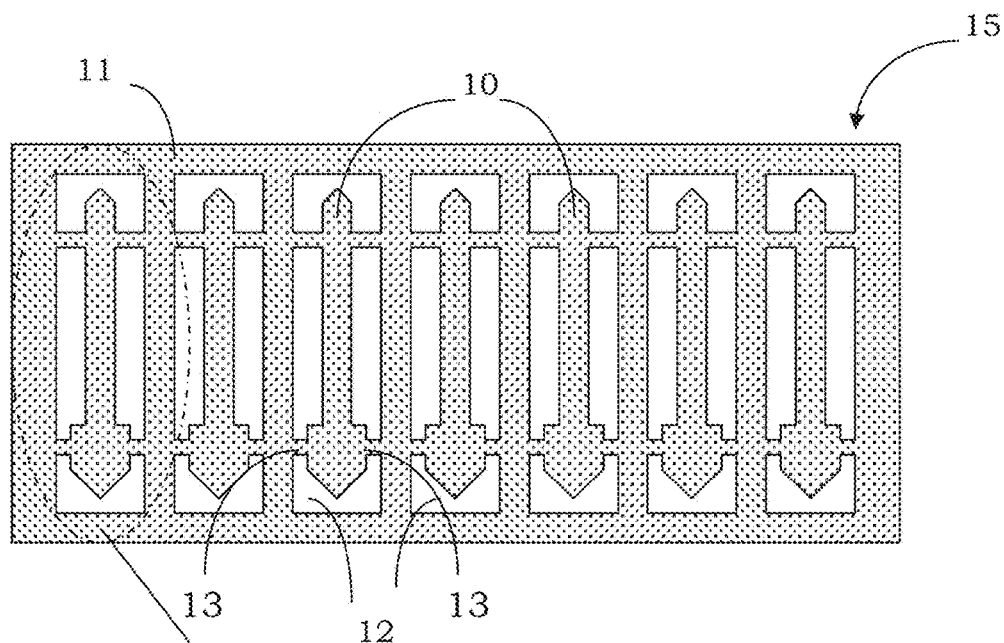
Figure 4B:
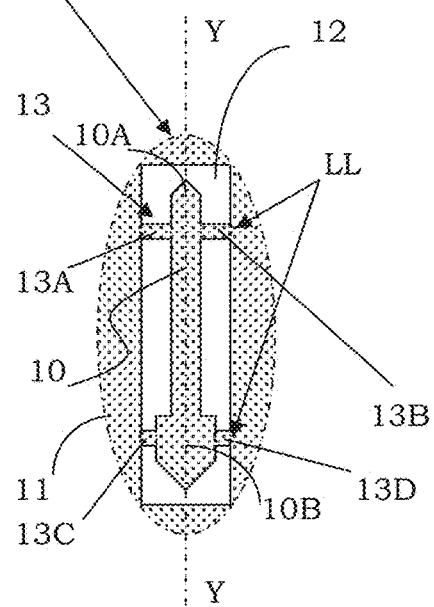

Obviously, it is possible to realize any number of material bridges 13, positioned also in other points of the contact probe 10 with respect to what shown in FIGS. 3A and 3B, in a totally random manner In particular, in the alternative embodiment shown in FIGS. 4A and 4B, the semi-finished product 15 according to the present disclosure includes a plurality of contact probes 10 realized in the substrate 11, each contact probe 10 being anchored to the substrate 11 by means of a respective plurality of material bridges 13.

As highlighted in the enlargement shown in FIG. 4B, each contact probe 10 is anchored to the substrate 11 by at least four material bridges 13, a first pair of material bridges realized at its end portion, in the example including its contact tip 10A, and by a second pair of material bridges realized at its further end portion, in the example including its contact head 10B, those first and second pairs of material bridges 13 being arranged symmetrically with respect to a longitudinal axis YY of the contact probe 10. Obviously, it is possible to provide more or less than four material bridges 13 for each contact probe 10, the material bridges 13 being positioned in symmetrical or asymmetrical configurations with respect to the longitudinal axis YY and at any position with respect to the probe portions.

Also in that case, as shown in FIG. 4B, the material bridges 13 can have weakening lines LL placed near the contact probe 10, so that the breakage thereof when separating the contact probe 10 from the substrate 11 causes a retaining of most of the material bridges 13 anchored to the substrate 11.

Figure 5A:
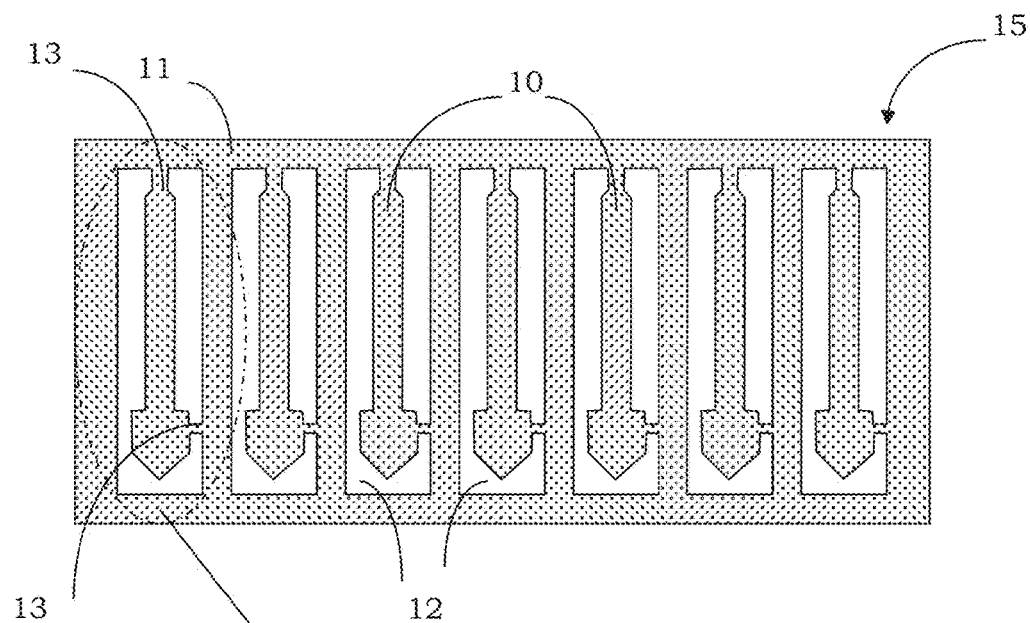
Figure 5B:
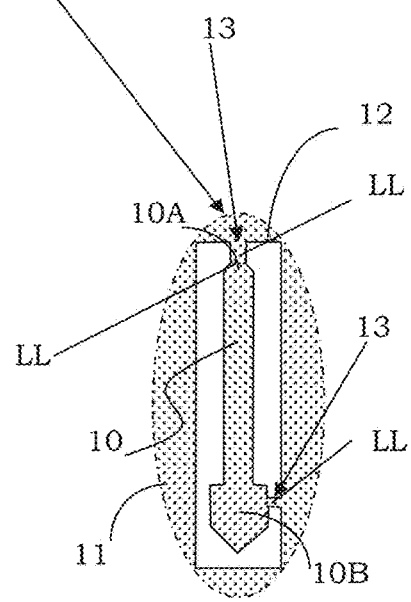

In a preferred embodiment, schematically shown in FIGS. 5A and 5B, the semi-finished product 15 includes a plurality of contact probes 10, each anchored to the substrate 11 by only two material bridges 13, one realized at its contact tip 10A, preferably in a central position, and the other realized at its contact head 10B, preferably in a lateral position, as shown in the figures.

It is also preferred an embodiment wherein each contact probe 10 is realized so as to be anchored to the substrate 11 by a material bridge 13 realized at its contact tip 10A, preferably in a central position, and by a pair of further material bridges 13 realized at its contact head 10B, preferably in a lateral position, symmetrically to each other (not shown in the figures).

It should be underlined that positioning at least one material bridge 13 on the end portion at the contact tip 10A of the contact probes 10 is particularly advantageous in the contact probe manufacturing methods including post-processing operations acting on the end portions of those probes; in that case, for example considering a re-shape operation of those end portions at the contact tips 10A of the contact probes 10 carried out after the separation of the contact probes 10 from the substrate 11, it allows removing possible buns or imperfections due to the breakage of the weakening lines LL and to the removal of the material bridges 13.

In that way, it is obtained an improvement of the mechanical and electrical operation of the contact probes 10 so obtained, as well as an improved resistance to the corrosion of the end portions so machined.

Moreover, it is expected an improvement of the sliding of the contact probes 10, in particular an improved sliding of the contact tips 10A on the respective contact pads of the device under test, since those end portions do not have roughness anymore after their re-shape step.

It is clearly possible to combine the above-described alternative embodiments, for example providing only one material bridge 13 realized at the contact tips 10A of the contact probes 10 and at least another material bridge 13 or also a pair of material bridges 13 realized in another position that is different from the end portion, for example in a central position.

Suitably, the substrate 11 is made of a conductive material adapted to realize contact probes for a testing head for electronic devices.

Figure 6A:
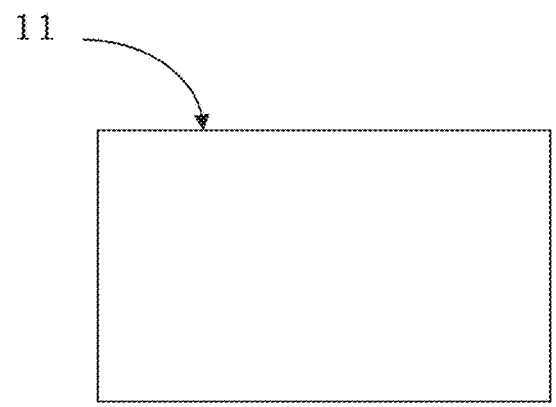
FIGS. 6A-6C schematically show alternative embodiments of a substrate for the semi-finished product according to the disclosure.
Figure 6B:
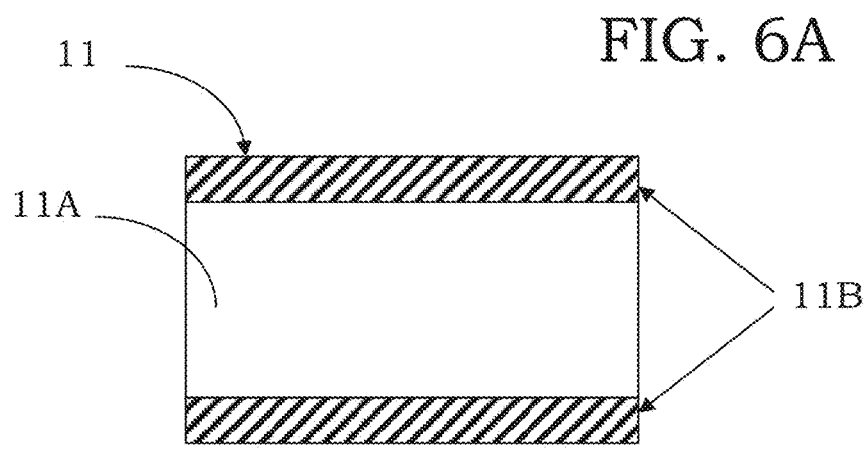
Figure 6C:
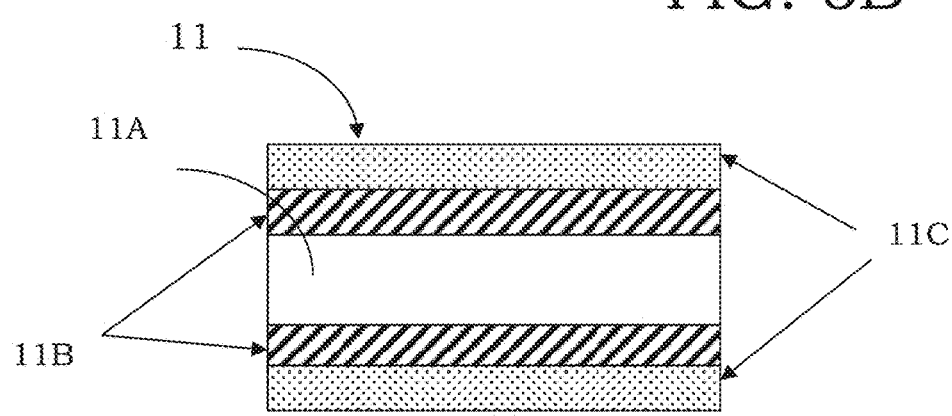

More particularly, as shown in the FIGS. 6A-6C, the substrate 11 can be made of a monolayer or multilayer conductive material adapted to realize contact probes for a testing head for electronic devices.

For example, the substrate 11 can be a monolayer made of a metal or a metal alloy selected from nickel or an alloy thereof, such as nickel-manganese, nickel-cobalt, nickel-iron, nickel-beryllium alloys or tungsten or an alloy thereof, such as tungsten-copper, tungsten-rhenium, or copper or an alloy thereof, such as copper-beryllium, copper-silver, copper-niobium, or rhodium or an alloy thereof, such as rhodium-ruthenium, or iridium or an alloy thereof or yet made of a semiconductor material, such as silicon.

In particular, that conductive material is selected so as to have electrical resistivity values less than 20 $\mu\Omega$/cm.

Alternatively, the substrate 11 can be a conductive multilayer and in particular can include at least one central layer or core 11A covered by one or more coating layers, for example a first coating layer 11B and a second coating layer 11C, which are adapted to improve the electro-mechanical performances and/or the hardness performances of the contact probes realized starting from that multilayer substrate 11, as shown in the FIGS. 6B and 6C.

In particular, the core 11A can be made of a metal or a metal alloy selected from the above mentioned ones for a monolayer substrate 11 and can be covered by one or more coating layers made of a conductive material, having high conductivity values, selected from copper, silver, palladium or alloys thereof or made of graphene and/or of a conductive material, having high hardness values, selected from rhodium, ruthenium nickel-phosphor, nickel-palladium, palladium and alloys thereof, or made of graphene, or yet made of doped or non-doped DLC ("Diamond Like Carbon").

Figure 7A:
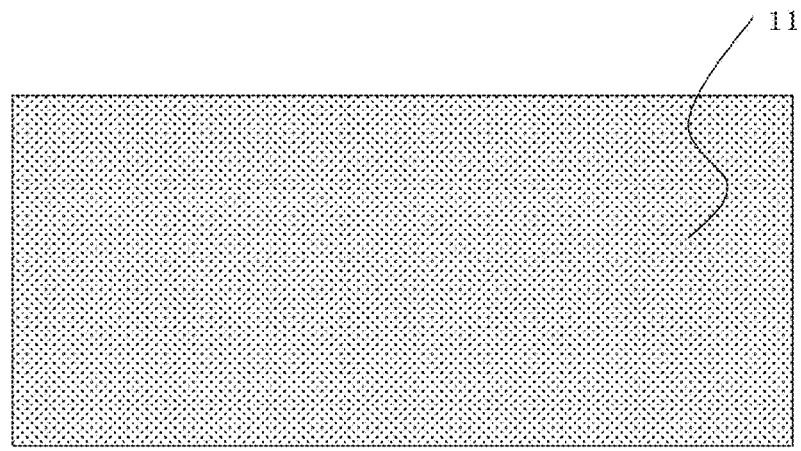
FIGS. 7A-7C schematically show the semi-finished product of FIG. 5A during different steps of the corresponding manufacturing method according to the disclosure.
Figure 7B:
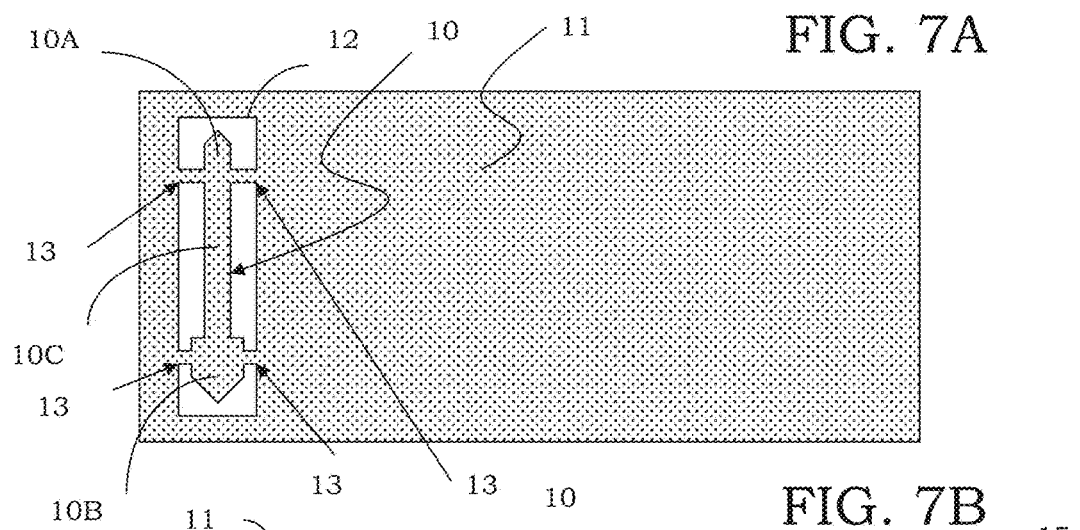
Figure 7C:
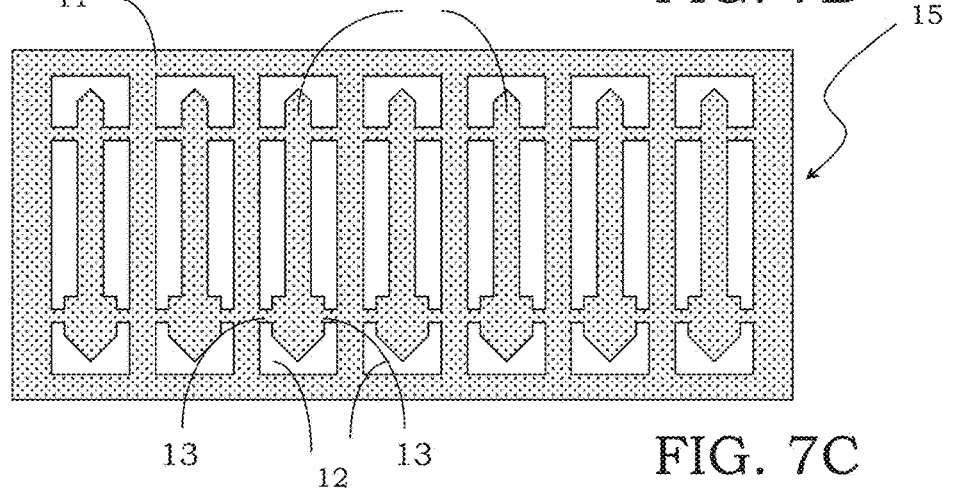

Such a semi-finished product 15 is obtained by means of a manufacturing method shown referring to FIGS. 7A-7C. In particular, although it is described referring to the embodiment of the semi-finished product 15 shown in FIG. 4A, it should be underlined that the method described in the following can be used to realize a semi-finished product 15 according to the embodiments shown in the FIGS. 3A and 5A, as well as according to their above-described variations.

The manufacturing method of the semi-finished product 15 according to the present disclosure includes the steps of:
providing a substrate 11 made of a conductive material, as shown in FIG. 7A; and
defining each contact probe 10 by removing material from the substrate 11.

In particular, as shown in FIG. 7B, each contact probe 10 is realized in a suitable recess, which is essentially frame-shaped, shown simply as frame 12, realized in the substrate 11 by removing material and adapted to surround the contact probe 10.

Advantageously according to the present disclosure, the defining step realizes the contact probe 10 so that it turns out to be anchored to the substrate 11 by one or more material bridges 13. In the example shown in FIG. 7B, the contact probe 10 is anchored to the substrate 11 by a first pair of material bridges, realized at an end portion thereof, in the example its contact tip 10A, and by a second pair of material bridges, realized at a further end portion thereof, in the example its contact head 10B.

Suitably, as schematically shown in FIG. 7C, the defining step allows realizing a plurality of contact probes 10 in a plurality of frames 12, each contact probe 10 being surrounded by a respective frame 12 and being anchored to the substrate 11 by a respective plurality of material bridges 13. Although in the shown examples the contact probes 10 of a semi-finished product 15 have the same geometrical configurations, and in particular also a same number and position of the material bridges 13, as well as the respective frames 12, it should be underlined that the defining step allows realizing a plurality of contact probes 10 in a plurality of frames 12 having any shape and dimension, as long as the frames are contained in the substrate 11 and the contact probes 10 are secured to the substrate 11 by at least one material bridge 13.

The defining step of the contact probes 10 in the substrate 11 in particular provides a material removal from the substrate 11 to open the frames 12.

In a preferred embodiment, the defining step includes a laser cutting step, in particular in correspondence with a contour of the contact probes 10 and of the material bridges 13.

Alternatively, the defining step includes a photolithographic etching step by means of a masking process and of a subsequent chemical etching, which in turn can include one or more masking and etching steps. The defining step can also include a selective chemical etching step of the substrate 11.

At the end of the defining step, the semi-finished product 15 is obtained including the plurality of contact probes 10, all still anchored to the substrate 11 by the material bridges 13, as shown in FIG. 7C.

Further, the manufacturing method of the semi-finished product 15 can include at least one processing step which is carried out onto all the contact probes 10 that are included therein.

In particular, the processing step can involve a part or all the contact probes 10 of the semi-finished product 15 at the same time or in close sequence.

That processing step involving all the contact probes 10 of the semi-finished product 15 can include one or more steps selected from a coating step, a covering step, a laser, photolithographic or electrochemical defining step, an electroplating step, an electrogalvanic deposition step, a micromechanical processing step, a sputtering step, a physical or chemical etching step, just to name some of them.

That processing step can particularly affect at least one portion of the contact probes 10, preferably a portion selected from an end portion, meaning a portion including the contact tip 10A or the contact head 10B of the contact probe 10, or a central portion, meaning a portion that does not include the contact tip 10A nor the contact head 10B of the contact probe 10.

Alternatively, the processing step can affect the contact probes 10 as a whole.

That processing step can also include multiple repeated steps of a same type for the same or different portions of the semi-finished product 15.

In a preferred embodiment of the disclosure, schematically shown in FIGS. 8A-8D, the processing step includes a coating step of the semi-finished product 15 and therefore of all the contact probes 10 included therein.

In particular, the coating step can provide the realization of a coating film made of a coating material selected from a conductive material and a dielectric material.

In case of a conductive coating material, it is possible to use a material having high electrical conductivity values, in particular a metal or a metal alloy selected from palladium or alloys thereof, such as nickel-palladium, copper and alloys thereof, such as copper-niobium or copper-silver, rhodium and alloys thereof, silver or gold or alloys thereof or made of graphene, or even made of doped DLC ("Diamond Like Carbon").

Preferably, the conductive coating material is selected from the noble metals group, more preferably gold.

In particular, that conductive material is selected so as to have electrical resistivity values less than 20 µΩ/cm.

In case of a dielectric coating material, it is possible to use fluorinated polymers, poly(p-xylylene) polymers, preferably Parylene®, of the C type or of the F type, copolymers thereof or nanocomposites or non-doped DLC ("Diamond Like Carbon"). In particular, the dielectric coating material is selected so as to have electrical resistivity values greater than $10^{15}$ Ω/cm.

Figure 8A:
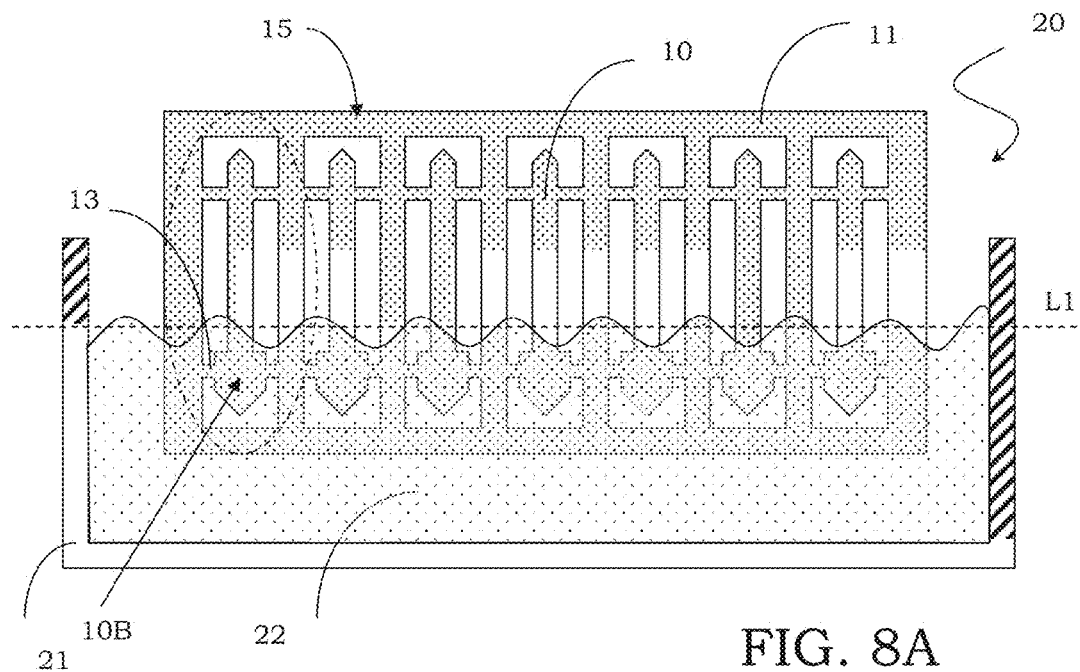
FIGS. 8A-8D schematically show different steps of the manufacturing method of the semi-finished product according to the disclosure.
Figure 8B:
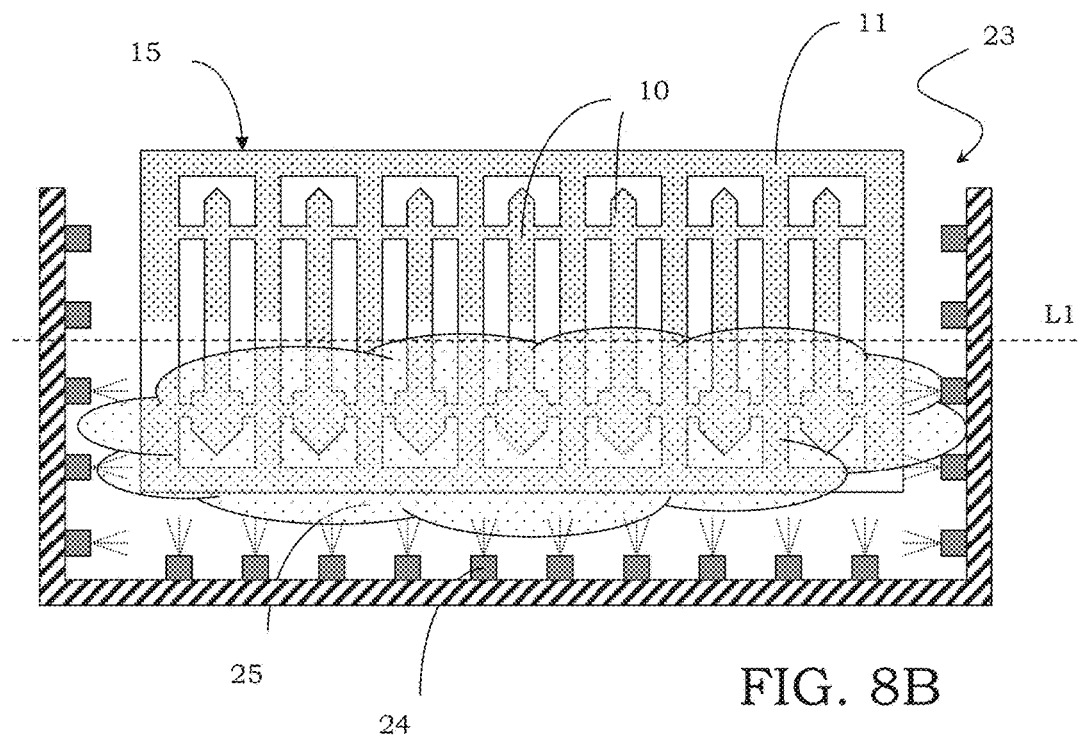
Figure 8C:
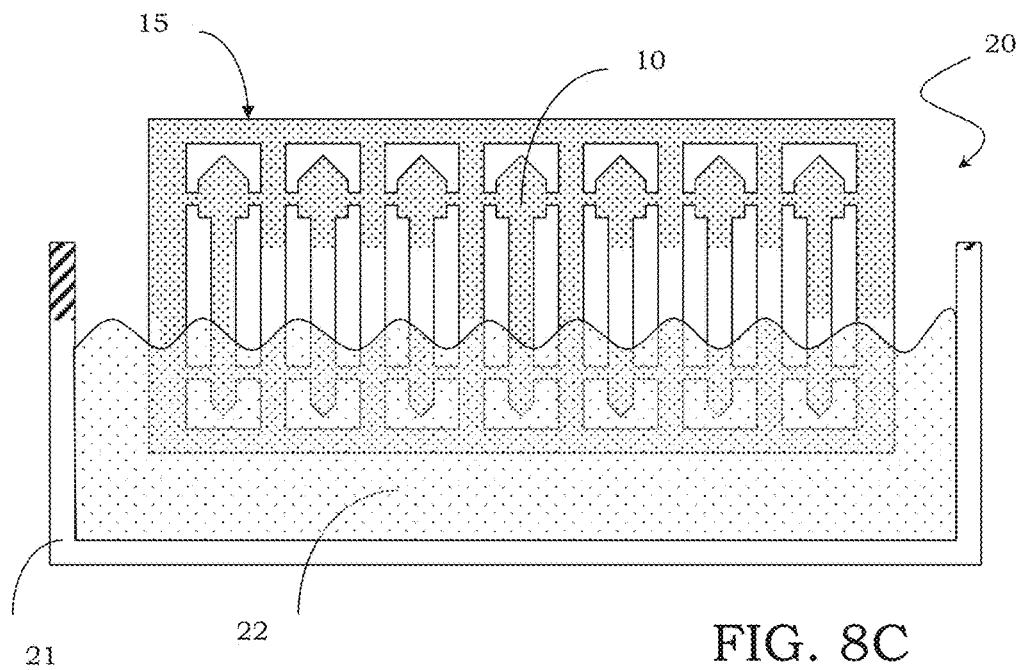

In one embodiment, as schematically shown in FIGS. 8A and 8C, the coating step can occur by immersion of the semi-finished product 15 in an immersion bath 20 including a tank 21 filled up to a coating level L1 by the coating material in liquid phase, which coating material is indicated with the reference number 22.

The coating level L1 determines the portion of the semi-finished product 15 and therefore of the contact probes 10 that is affected by the coating film, for example only one portion of the semi-finished product 15 corresponding to an end portion of the contact probes 10, in particular including the contact head 10B, as shown in FIG. 8A, or the contact tip 10A, as shown in FIG. 8C. Clearly, that coating step by immersion can affect the entire semi-finished product 15 or a portion thereof including the contact probes 10 as a whole.

The coating step by immersion can be realized without current or can be of electrogalvanic type.

Figure 8D:
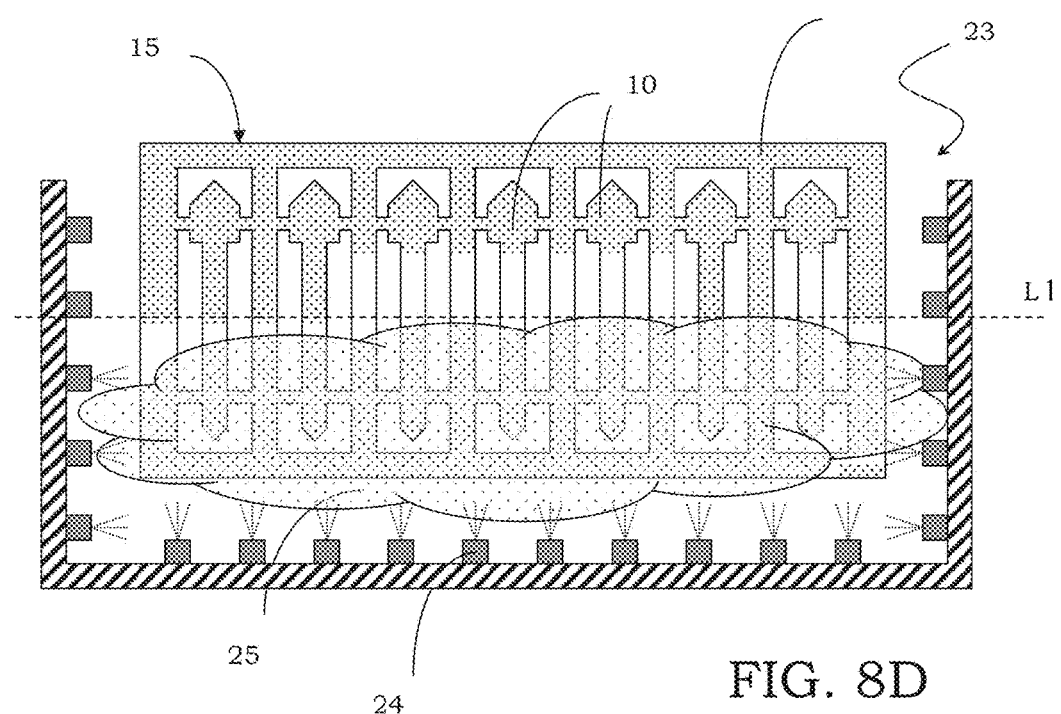

Alternatively, the coating step can occur by deposition of a coating material in vapor phase, in particular by inserting the semi-finished product 15 in a vaporization chamber 23, equipped with one or more nozzles 24 adapted to spray a coating material in vapor phase, indicated with the reference number 25, as schematically shown in FIGS. 8B and 8D, at an end portion including the contact tip 10A of each contact probe 10, or at the end portion including the contact head 10B of each contact probe 10, as respectively shown in FIGS. 8B and 8D. Also in that case, the coating step by vaporization can affect the entire semi-finished product 15 or a portion thereof including the contact probes 10 as a whole.

It is also possible to provide that the processing step includes a first coating step of the semi-finished product 15 at a first end portion of the contact probes 10, for example including the respective contact heads 10B, followed by a second coating step of the semi-finished product 15, for example at a second end portion of the contact probes 10 including the contact tips 10A, in this sequence or in the opposite sequence, those first and second coating steps being realized by immersion or by vaporization.

Furthermore, the coating step can include one or more steps of material deposition realized by means of a cathode sputtering process, wherein atoms, ions or molecular fragments are emitted by a solid material, called target, when bombarded with a beam of energetic particles and recondense on the surfaces of the semi-finished product 15, and therefore on the whole or part of the extension of the contact probes 10 made therein, when the semi-finished product 15 is placed in a special vacuum chamber together with the target coating material suitably bombarded.

Figure 9A:
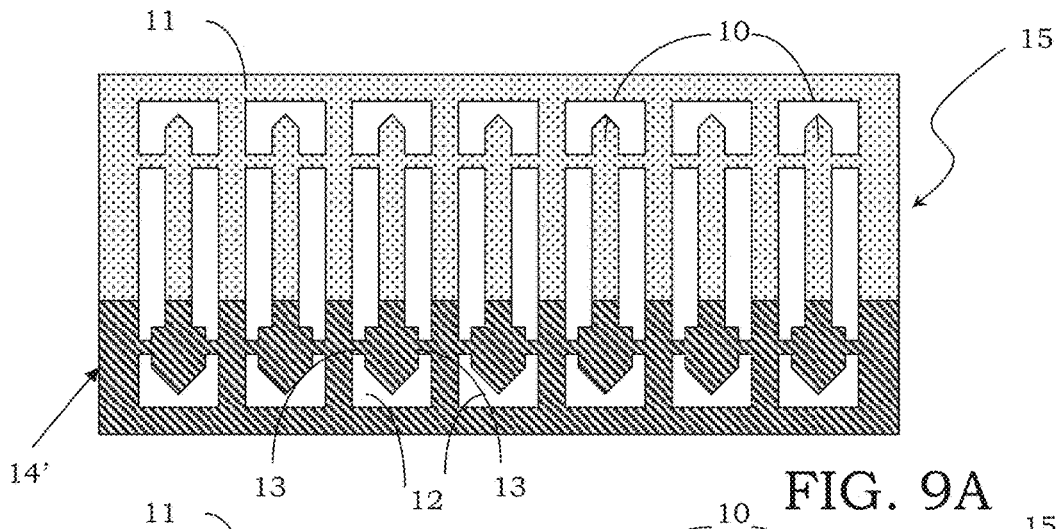
FIGS. 9A-9C schematically show alternative embodiments of the semi-finished product realized by means of the manufacturing method of the disclosure according to the variations shown with reference to FIGS. 8A-8D.
Figure 9B:
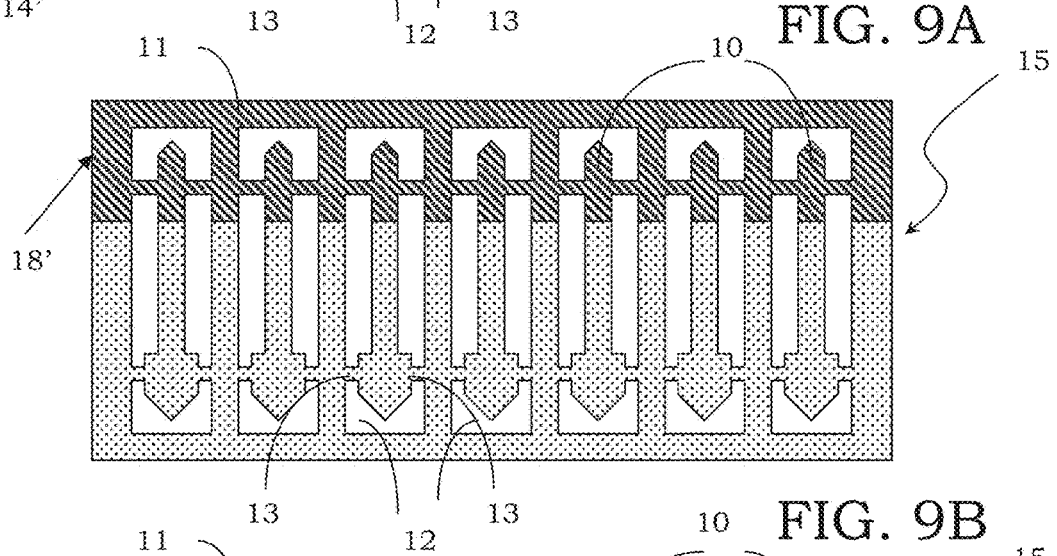

In that way a semi-finished product 15 is obtained including at least one coated portion, for example at the contact heads 10B of the contact probes 10, which coated portion is indicated with the reference number 14' in FIG. 9A, or at the contact tips 10A of the contact probes 10, which coated portion is indicated with the reference number 18' in FIG. 9B.

Figure 9C:
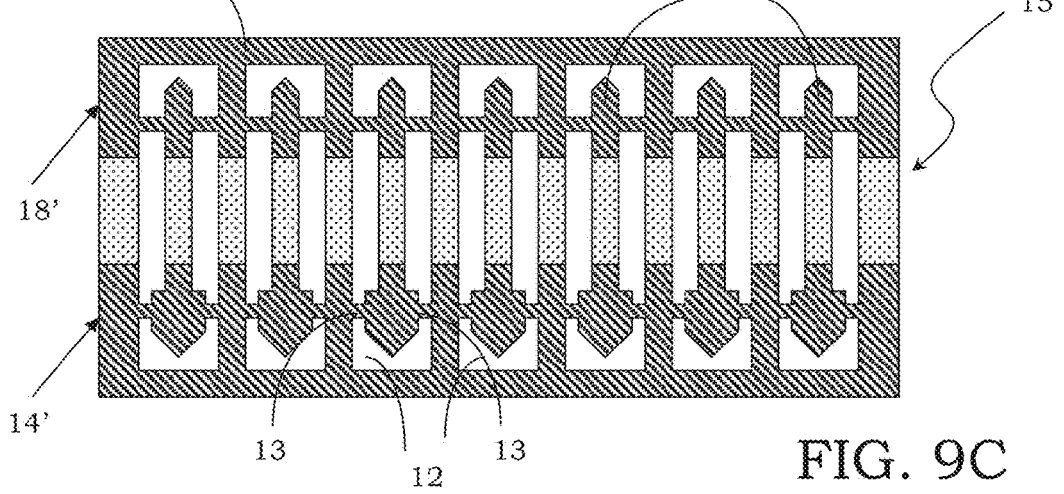

It is also possible to obtain a semi-finished product 15 including a first coated portion 14' at the contact heads 10B of the contact probes 10 and a second coated portion 18' at the contact tips 10A of the contact probes 10, as schematically shown in FIG. 9C.

Furthermore, it is possible to obtain a semi-finished product 15 including a coated portion substantially extending like the contact probes 10 as a whole.

At the end of the different steps which the semi-finished product 15 undergoes, the contact probes 10 are then separated from the substrate 11, preferably by breakage of weakening lines LL and removal of material bridges 13, which anchor those contact probes 10 to the substrate 11.

In the case of a processing step including one or more coating steps, after the separation, a plurality of contact probes 10 is obtained, each having at least one end portion provided with a coating film.

Figure 10A:
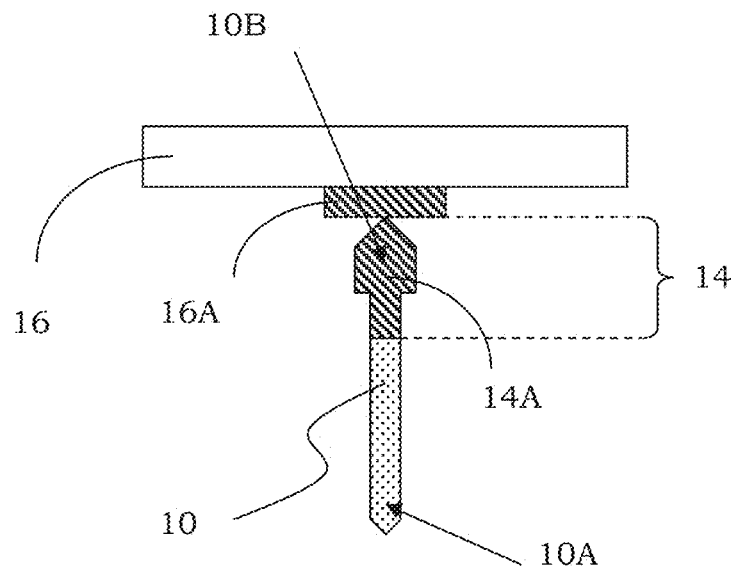
FIGS. 10A-10D schematically show a contact probe obtained from the semi-finished product of the disclosure according to the alternative embodiments shown referring to FIGS. 9A-9C.

In particular, starting from a semi-finished product 15 of the type shown in FIG. 9A, a plurality of contact probes 10 is obtained, each including at least one coated portion 14' comprising the contact head 10B and provided with a coating film 14A made of the coating material of the coated portion 14', as schematically shown in FIG. 10A.

In an embodiment, that coating film 14A at the end portion 14 including the contact head 10B is made of a coating material, having high conductivity values, selected from copper, silver, gold, palladium or alloys thereof or made of graphene.

In a preferred embodiment of the disclosure, the conductive coating material is selected from the noble metals group, more preferably gold. In that way, the contact probe 10 has improved electrical contact proprieties between its end portion 14 and a contact pad, for example a contact pad 16A of a space transformer 16 in the case of a testing head comprising non-blocked probes, as shown again in FIG. 10A.

Also the contact pads 16A of the space transformer 16 in turn can be made of or coated by a conductive material, in particular a metal or a metal alloy, more in particular the same material realizing the coating film 14A of the end portion 14 including the contact head 10B of the contact probe 10, preferably gold.

It is similarly possible to make the coating film 14A at the end portion 14 including the contact head 10B of a coating material having high hardness values, in particular a material having hardness values greater than 500 Hv on the Vickers Scale (equivalent to 4903.5 MPa). Preferably, the coating material is selected from palladium or alloys thereof, such as nickel-palladium, copper and alloys thereof, such as copper-niobium or copper-silver, rhodium and alloys thereof, silver or gold or alloys thereof or made of graphene, or yet made of doped DLC ("Diamond Like Carbon").

In a preferred embodiment of the disclosure, the coating material is rhodium, the contact probe 10 thus having improved wear resistance proprieties of its end portion 14, in particular of its contact head 10B.

Figure 10B:
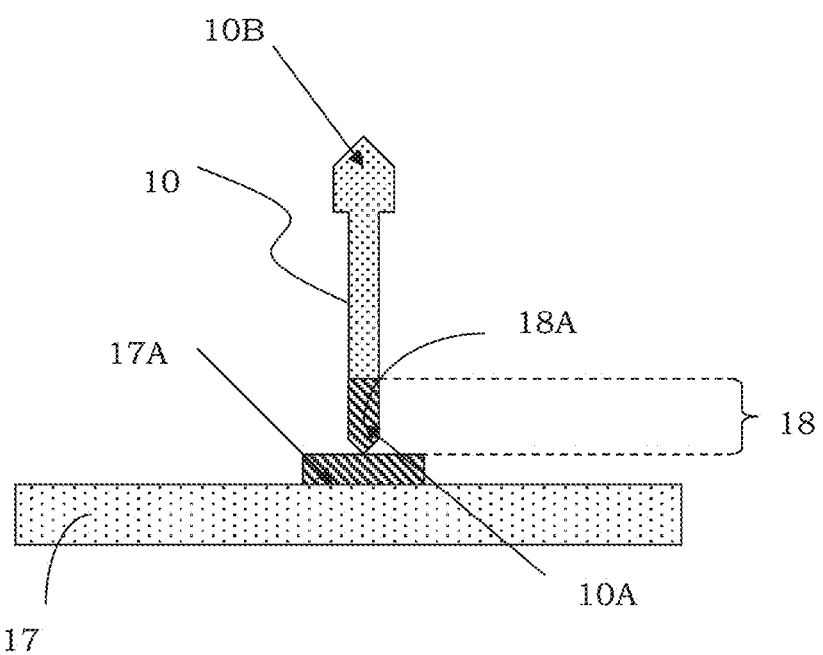

Similarly, starting from a semi-finished product 15 like the one shown in FIG. 9B, a plurality of contact probes 10 is obtained, each probe having at least one end portion 18 including the contact tip 10A and provided with a coating film 18A made of the coating material of the coated portion 18', as schematically shown in FIG. 10B.

In particular, that coating film 18A at the end portion 18 including the contact tip 10A can be made of a highly conductive coating material so that the contact probe 10 has improved electrical contact proprieties between its end portion 18 and a contact pad, for example a contact pad 17A of a device under test 17, as shown in FIG. 10B.

Also the contact pads 17A of the device under test 17 in turn can be made of or coated by a conductive material, in particular the same material realizing the coating film 18A of the end portion 18 including the contact tip 10A of the contact probe 10.

Alternatively, the coating film 18A at the end portion 18 including the contact tip 10A can include a coating material having high hardness, the contact probe 10 thus having improved wear resistance proprieties of its end portion 18, in particular of its contact tip 10A.

Figure 10C:
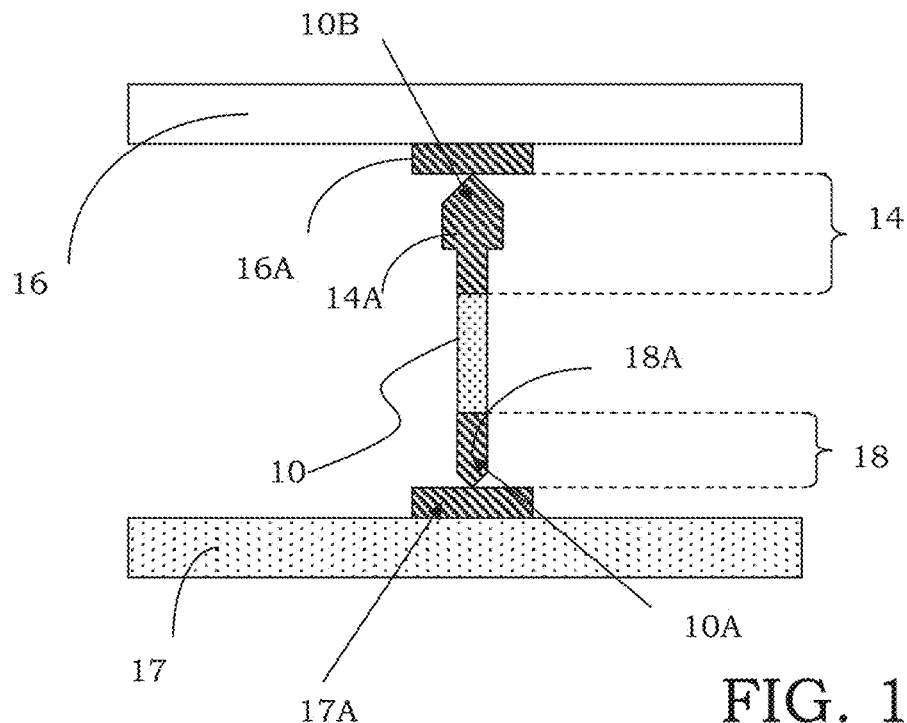

Finally, starting from a semi-finished product 15 like the one shown in FIG. 9C, it is also possible to obtain a plurality of contact probes 10, each having a first end portion 14 including the contact head 10B and provided with a first coating film 14A made of the coating material of the first coated portion 14' and a second end portion 18 including the contact tip 10A and provided with a second coating film 18A made of the coating material of the second coated portion 18', as schematically shown in FIG. 10C. Suitably, those first and second coating film 14A and 18A can be made of the same coating material or of different materials and they can be monolayer or multilayer.

Figure 10D:
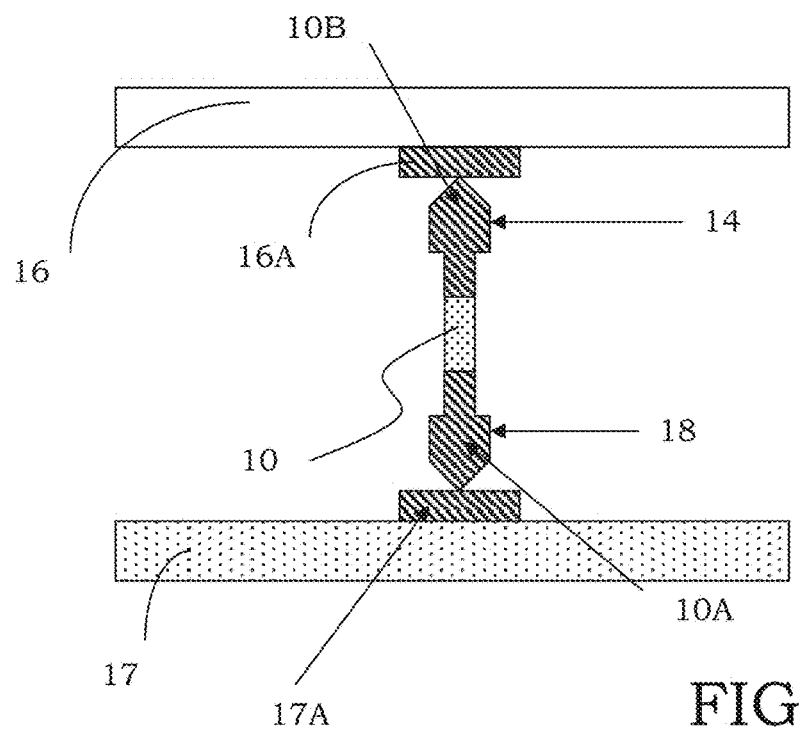

It is also possible to consider contact probes 10 having the same or different shape and dimensions at the end portions 14 and 18, like in the alternative embodiments of FIGS. 10C and 10D, respectively.

Figure 11A:
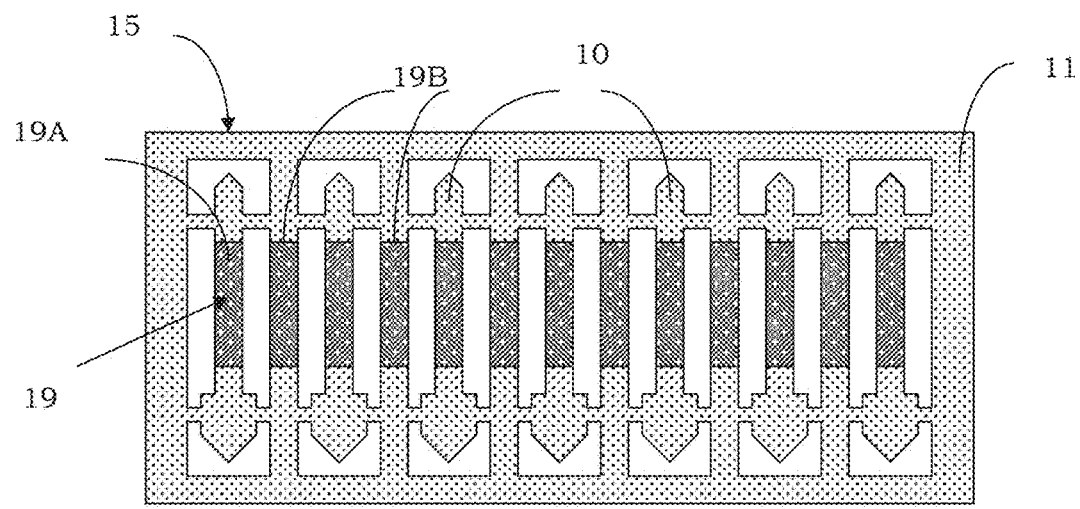
FIGS. 11A and 11B schematically show alternative embodiments of the semi-finished product according to the present disclosure.
Figure 11B:
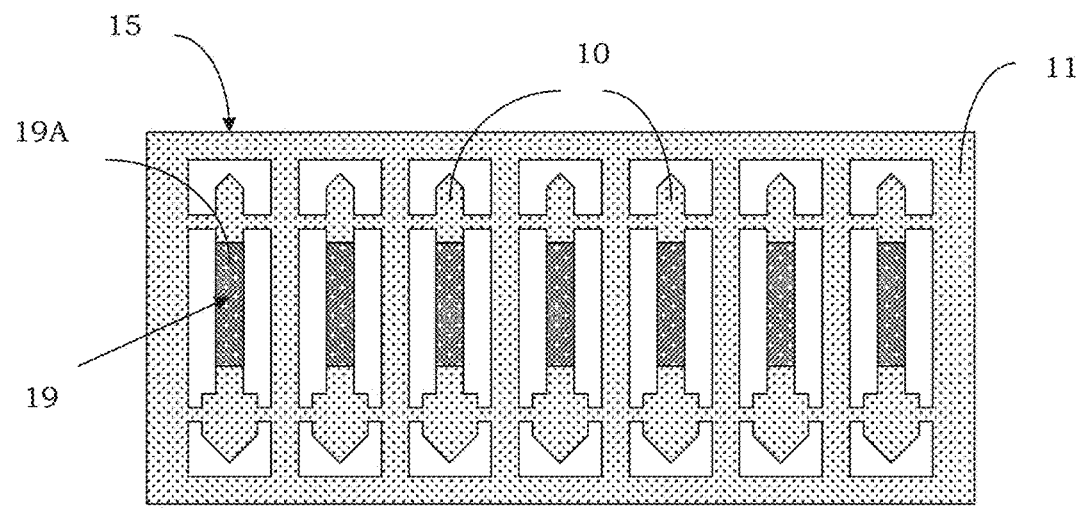

Furthermore, advantageously according to the present disclosure, the manufacturing method of the semi-finished product 15 including the plurality of contact probes 10 includes a covering step by means of a dielectric covering material of at least one portion of the semi-finished product 15, so as to provide at least one covering film 19 in a central portion 19A of the contact probes 10, the term central portion meaning a portion not including the contact tip 10A nor the contact head 10B, as schematically shown in the FIGS. 11A and 11B.

Suitably, the covering film 19 is made of a dielectric material, in particular selected from fluorinated polymers, poly(p-xylylene) polymers, preferably Parylene®, in particular of the C type or of the F type, copolymers thereof or nanocomposites or non-doped DLC ("Diamond like Carbon"), preferably Parylene®, of the C type or of the F type.

More particularly, the covering step can include a total coating step of the contact probes 10 by means of the covering material and subsequent masking of the semi-finished product 15 and removal of the covering material outside a portion of interest of the contact probes 10, consequently realizing the covering film 19 only in the portion of interest, for example a central portion 19A. In particular, a semi-finished product 15 is thus obtained having a plurality of contact probes 10 provided with respective central portions 19A covered by the covering film 19, as schematically shown in FIG. 11A, when applying a substantially rectangular mask covering the band of the semi-finished product 15 extending at the central portions 19A of the contact probes 10. In that case, portions 19B of the covering film 19 are left also on central portions of the substrate 11 at the frames 12 surrounding the contact probes 10.

Alternatively, it is possible to use a more complex mask, in particular a reticulated one so as to leave uncovered only the central portions 19A of the contact probes 10, as schematically shown in FIG. 11B.

By way of a non-limiting example, the covering step includes a chemical vapor deposition (CVD) step or a passivation.

It is also possible to provide that the processing step affecting all the probes includes that covering step intended to realize the covering film 19.

In that case, advantageously according to the present disclosure, the processing step can include at least one coating step of at least one portion of the semi-finished product 15, in particular corresponding to a central portion 19A of the contact probes 10, with a dielectric covering material apt to realize a coated central portion 19' including the covering film 19.

Conveniently, that coating step with a dielectric covering material can include an immersion step of the semi-finished product 15, provided with a suitable covering mask, in the dielectric covering material in liquid phase, shown as 26, using the tank 21 of the immersion bath 20.

Figure 12A:
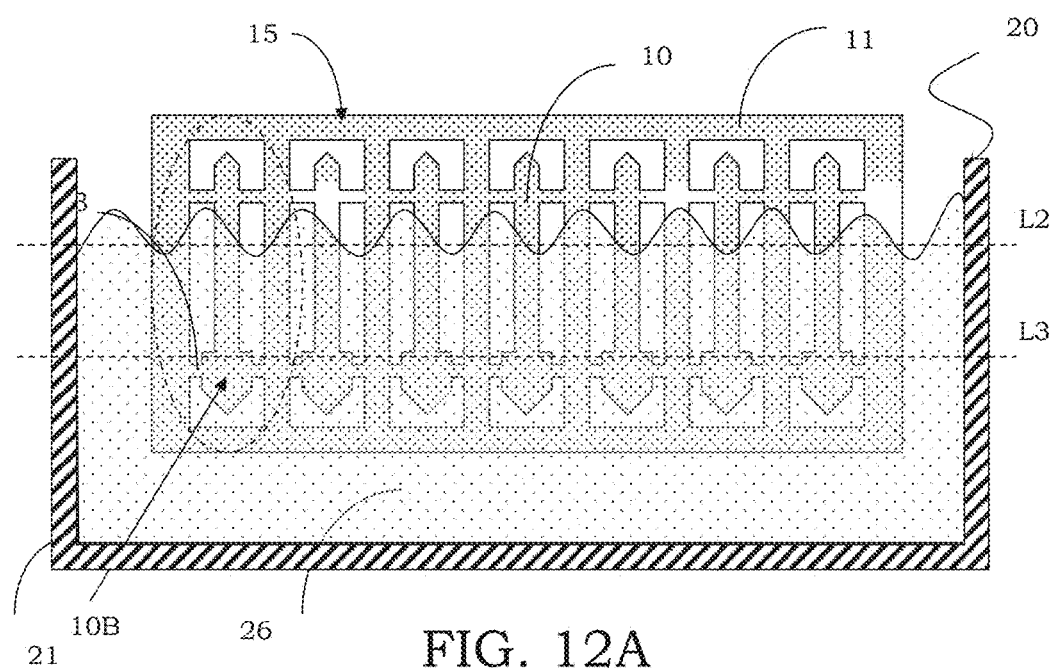
FIGS. 12A and 12B schematically show one step of the manufacturing method according to the present disclosure.

In that case, it should be underlined that, considering a central portion 19A of the contact probes 10 extending from an upper coating level L2 to a lower coating level L3, the dielectric covering material in liquid phase 26 should reach in the tank 21 at least the upper coating level L2, as schematically shown in FIG. 12A.

As previously shown, the semi-finished product 15 can include a covering mask extending outside the central portions 19A of the contact probes 10, namely at least over the upper coating level L2 and below the lower coating level L3.

Alternatively, that coating step with a dielectric covering material can include an immersion step of the semi-finished product 15 in the dielectric covering material in liquid phase 26 reaching the desired upper coating level L2 followed by a removal step of the covering film 19 below the desired lower coating level L3.

It is also possible to consider a coating step with a dielectric covering material including a total immersion step of the semi-finished product 15 in the dielectric covering material in liquid phase 26 followed by a removal step of the covering film 19 over the desired upper coating level L2 and below the desired lower coating level L3.

Conveniently, the removal step of the covering film 19 can occur by chemical etching and possibly thanks to the use of suitable masks applied to the semi-finished product 15.

Figure 12B:
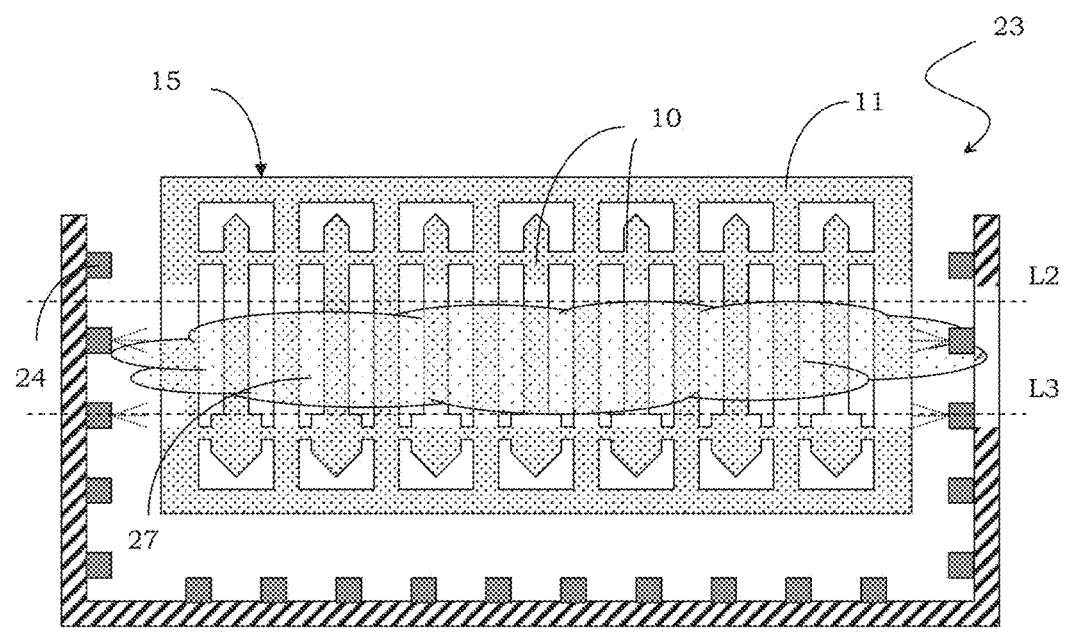

It is also possible to use a vaporization chamber 23, in order to spray a dielectric covering material in vapor phase, shown as 27, in order to realize the coated central portion 19' of the semi-finished product 15 at central portions 19A of the contact probes 10, as schematically shown in FIG. 12B.

Suitably, in that case only the nozzles 24 of the vaporization chamber 23 included between the upper coating level L2 and the lower coating level L3 are activated, which nozzles correspond to the extension of the central portions 19A which are covered with the covering film 19.

With respect to the coating step by immersion previously described, it should be underlined that, thanks to the use of the vaporization, it is already possible to realize the covering film 19 only at the portion of the semi-finished product 15 including the central portions 19A of the contact probes 10, realizing the coated central portion 19' and thus avoiding applying and removing a mask to the semi-finished product 15.

Figure 13:
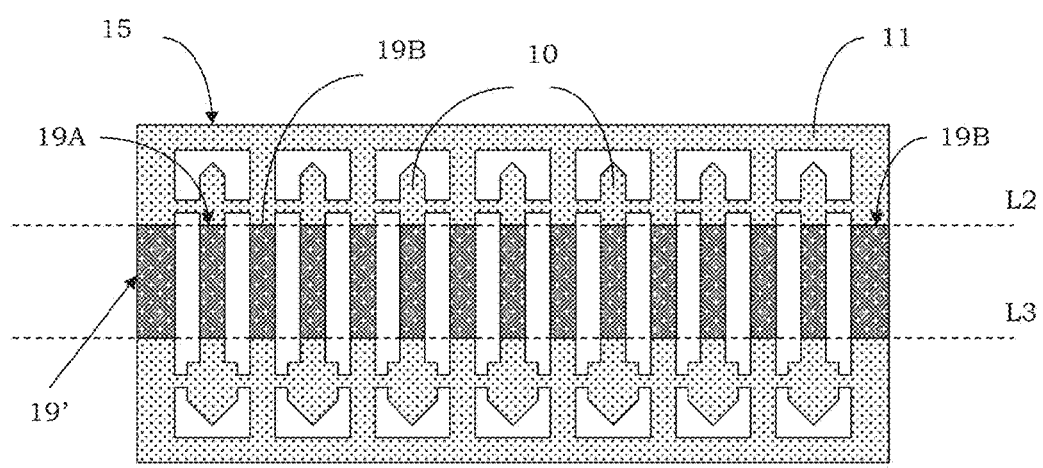
FIG. 13 schematically shows a further alternative embodiment of the semi-finished product according to the present disclosure realized by means of the manufacturing method of the disclosure shown referring to FIGS. 12A and 12B.

In that case, portions 19B of the covering film 19 can be left on the substrate 11 also at the frames 12, the coated central portion 19' extending along all the semi-finished product 15, as schematically shown in FIG. 13; it should be underlined that those portions 19B do not have any usefulness, but do not even affect the configuration or the performances of the contact probes 10 obtained from the semi-finished product 15 according to the present disclosure.

Actually, those portions 19B will be eliminated after the separation of the contact probes 10 from the semi-finished product 15, together with the substrate 11 without the contact probes 10 and possibly the material bridges 13.

In case of providing a semi-finished product 15 provided with a coated central portion 19' and arranged at least at one portion, in particular a central portion 19A of the contact probe 10, it should be underlined that any subsequent processing step can use also the covering film 19 as reference or "stopper".

In particular, in case of successive coating steps of end portions of the contact probes 10, the presence of the coated central portion 19' allows deciding a priori the dimensions of the end portions that will be coated by the coating material, provided that a covering material is chosen which is able to totally or however significantly prevent the adhesion of the coating material.

Figure 14A:
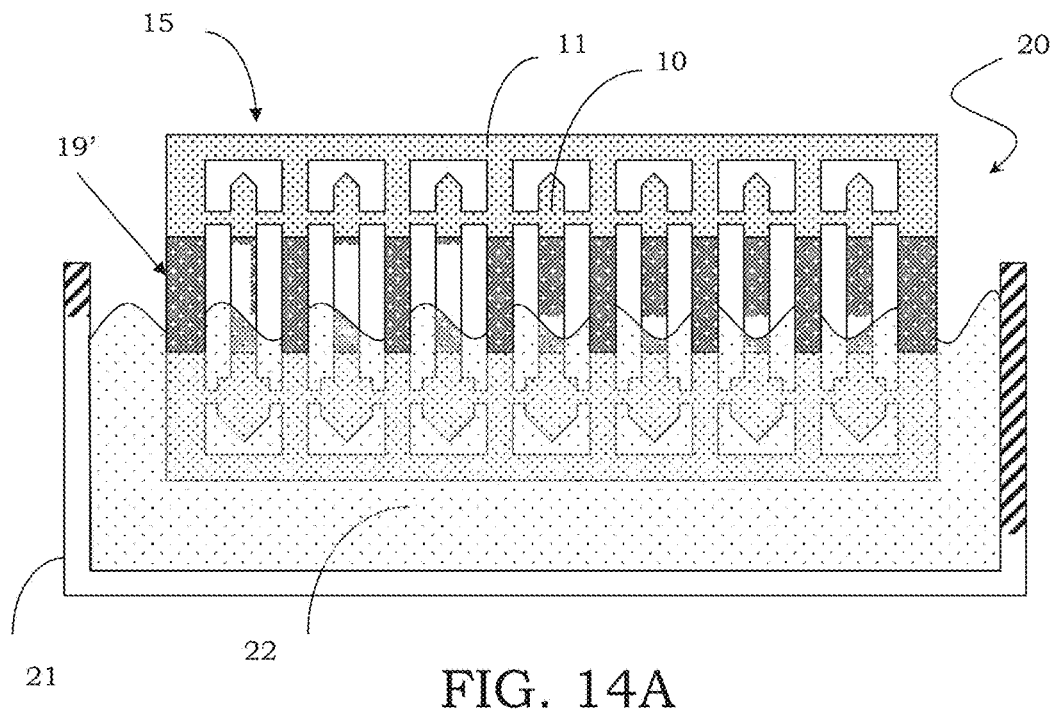
FIGS. 14A-14D schematically show one step of the manufacturing method according to different alternative embodiments of the disclosure starting from the semi-finished product of FIG. 13.
Figure 14B:
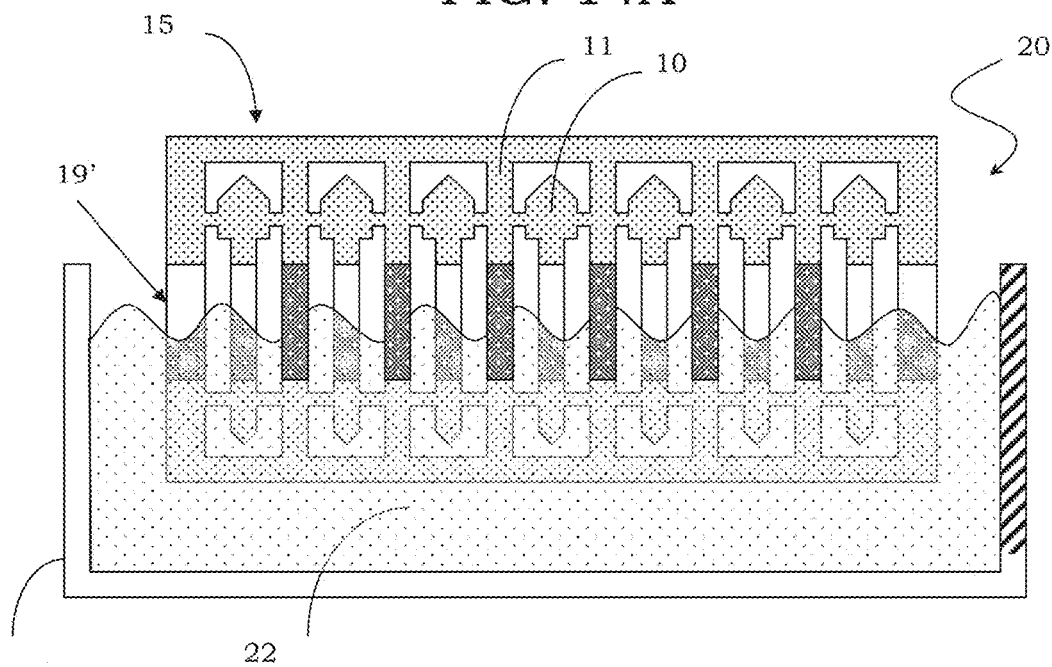
Figure 14C:
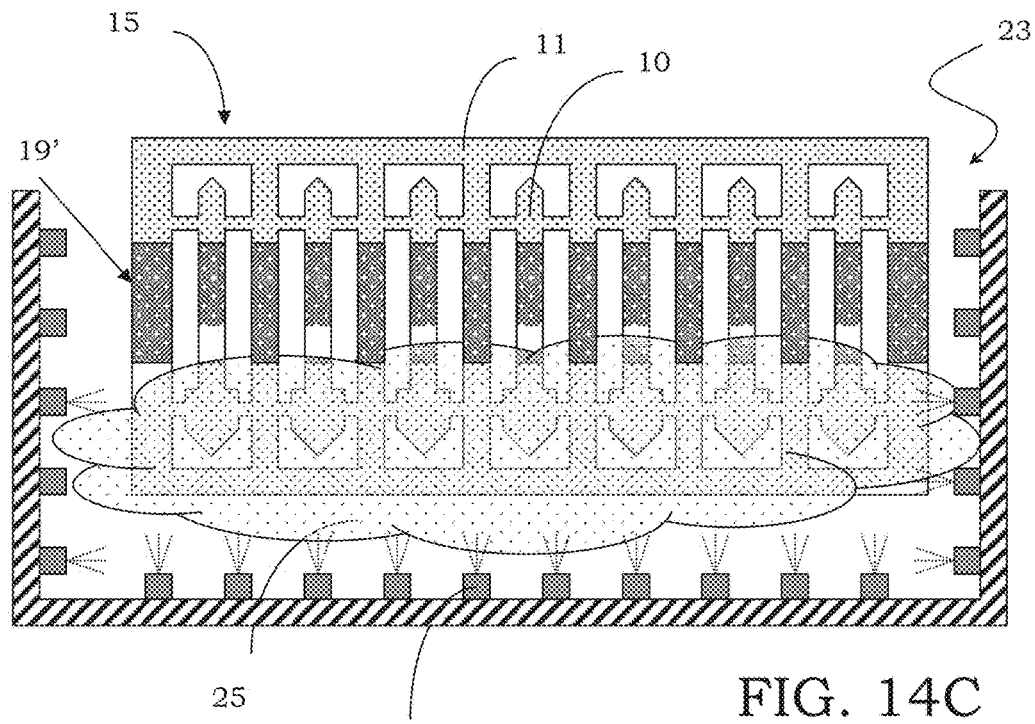
Figure 14D:
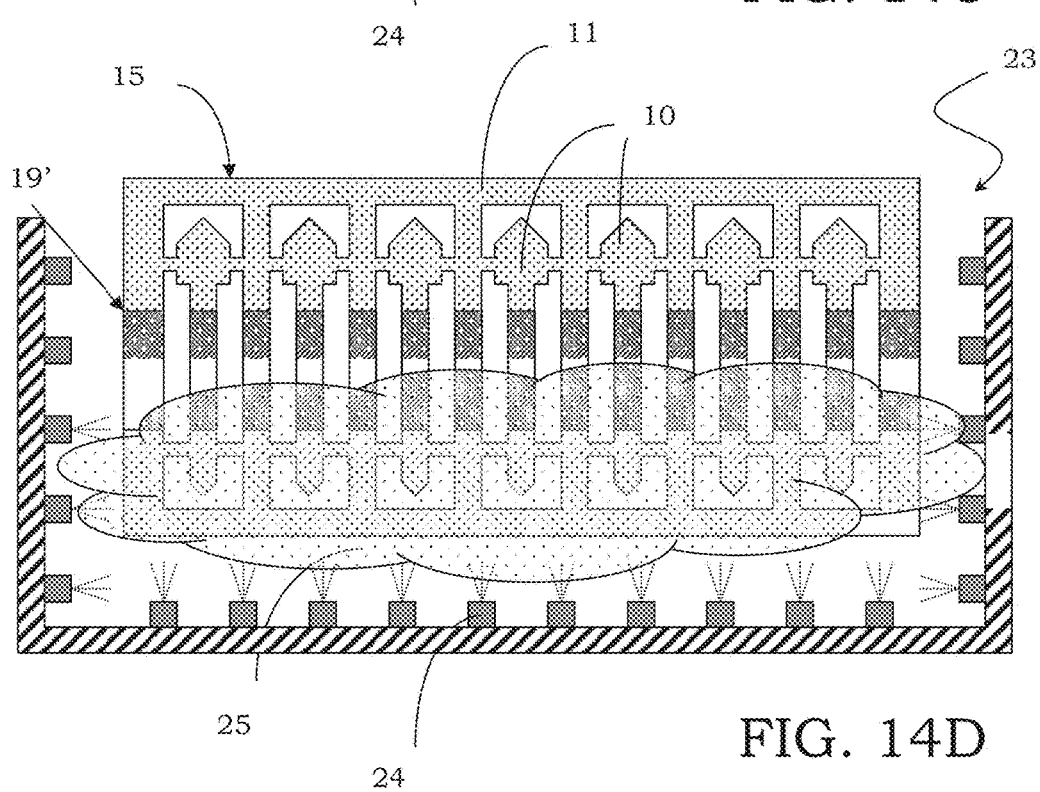

As previously shown, by way of a non-limiting example, it is possible to consider that the manufacturing method of the semi-finished product 15 including at least one coated central portion 19' includes one or more coating steps of one or both the end portions, 14 and 18, of the contact probes 10 by means of a coating material, in particular a metal material or an alloy thereof, preferably gold, by immersion of the semi-finished product 15 in the coating material in liquid phase 22, as schematically shown in FIGS. 14A and 14B, where the semi-finished product 15 is immersed at the contact heads 10B and at the contact tips 10A, respectively, or by insertion of the semi-finished product 15 in a vaporization chamber 23, as schematically shown in FIGS. 14C and 14D, where the semi-finished product 15 is vaporized at the contact heads 10B and at the contact tips 10A, respectively.

Figure 15A:
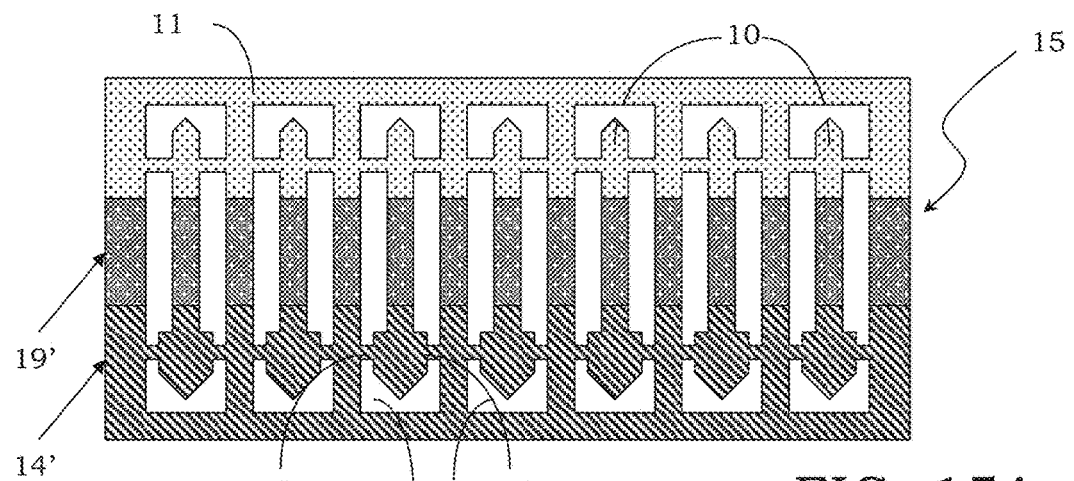
FIGS. 15A-15C schematically show alternative embodiments of the semi-finished product realized by means of the manufacturing method of the disclosure according to the variations shown referring to FIGS. 14A-14D.
Figure 15B:
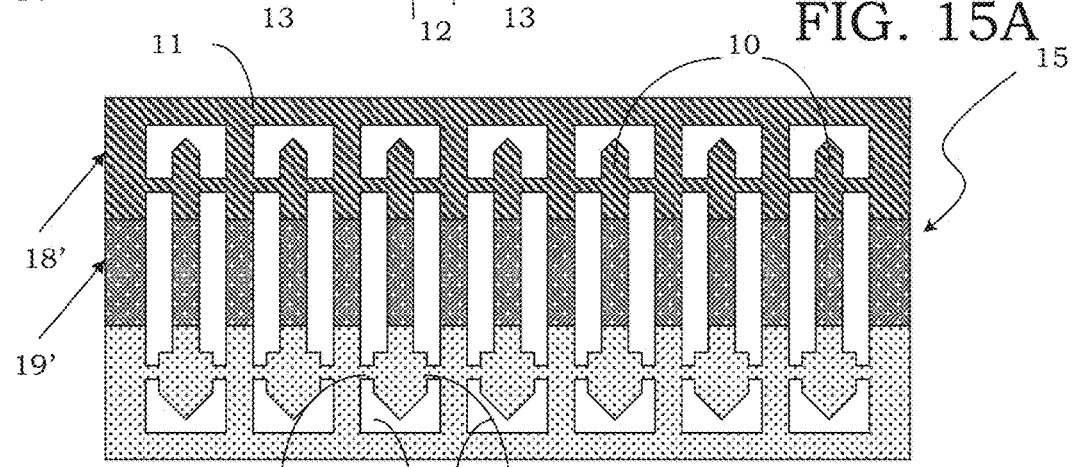

In that way a semi-finished product 15 is obtained including a coated central portion 19' and at least one further coated portion, for example at the contact heads 10B of the contact probes 10, which portion is indicated with the reference number 14' in FIG. 15A, or at the contact tips 10A of the contact probes 10, which portion is indicated with the reference number 18' in FIG. 15B.

Figure 15C:
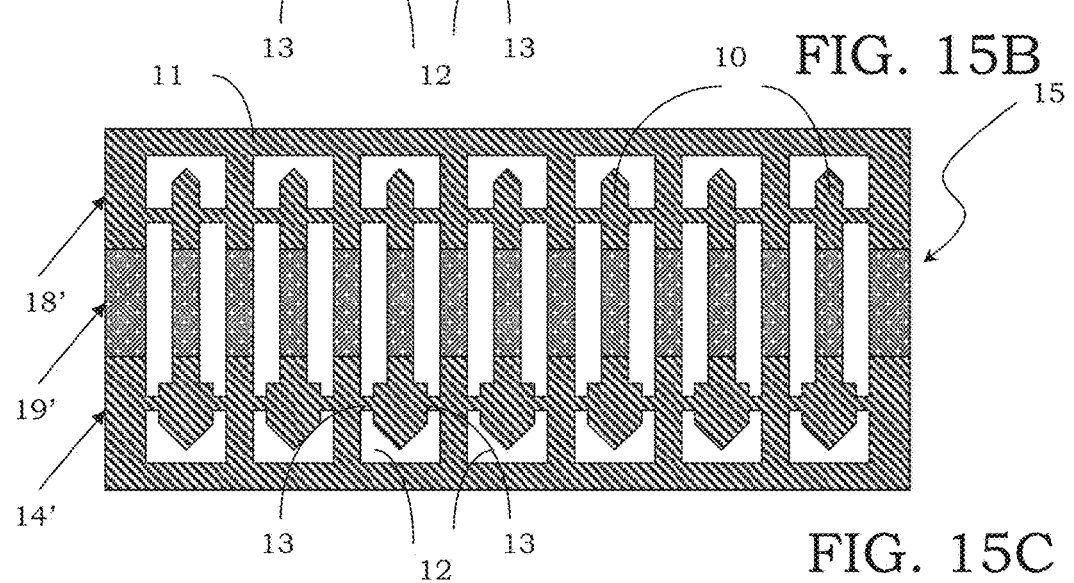

It is also possible to obtain a semi-finished product 15 including the coated central portion 19', as well as a further first coated portion 14' at the contact heads 10B of the contact probes 10 and a further second coated portion 18' at the contact tips 10A of the contact probes 10, as schematically shown in FIG. 15C.

As a consequence, the manufacturing method according to the present disclosure provides that the coating step realizes a coating film on at least one coated portion 14', 18', 19' of the semi-finished product 15, that at least one coated portion 14', 18' being at an end portion of the semi-finished product 15, meaning a portion comprising contact tips 10A or contact heads 10B of the contact probes 10 realized in the semi-finished product 15 and/or that at least one coated portion 19' being at a central portion of the semi-finished product 15, meaning a portion not comprising contact tips 10A nor contact heads 10B of the contact probes 10 realized in the semi-finished product 15.

Furthermore, it is possible to obtain a semi-finished product 15 including a coated portion substantially extending like the contact probes 10 as a whole.

It also underlined that the defining step realizes each of the contact probes 10 comprising at least one first material bridge 13 positioned in a central position, preferably in correspondence of a first end portion comprising a contact tip 10A of the contact probe 10 and one second material bridge 13 positioned in a lateral position, preferably in correspondence of a second end portion comprising a contact head 10B of the contact probe 10.

Moreover, the defining step further comprises a step of equipping each of the material bridges 13 with at least one weakening line LL passing through it and adapted to facilitate the separation of the contact probe 10 from the substrate 11 with breakage of the integrity of the material bridge 13, the at least one weakening line LL being obtained by a local thinning of the substrate 11 in its correspondence, according to a direction Z orthogonal to a plane of the semi-finished product 15.

At the end of the different steps which the semi-finished product 15 undergoes, the contact probes 10 are then separated from the substrate 11, preferably by means of breakage of weakening lines LL and removal of material bridges 13, which anchor those contact probes 10 to the substrate 11.

Figure 16A:
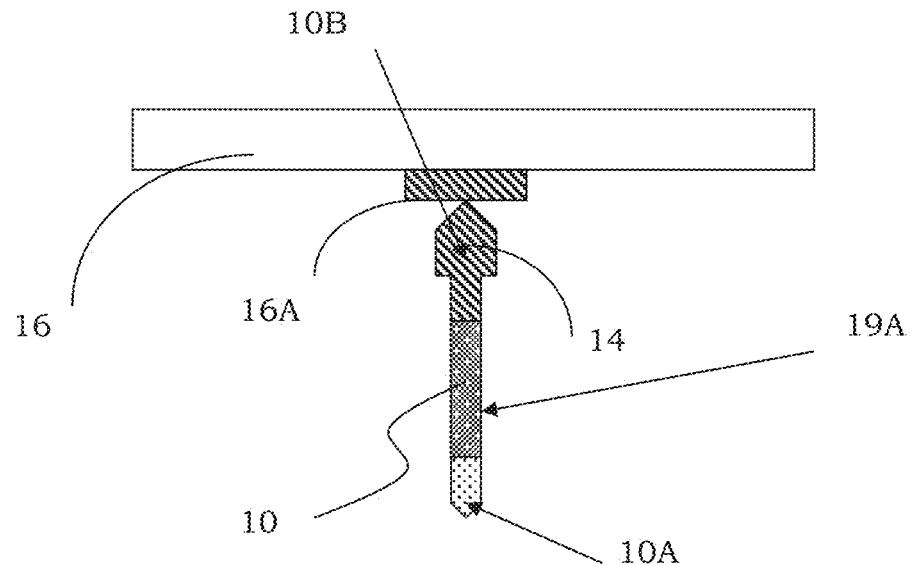
FIGS. 16A-16C schematically show a contact probe obtained from the semi-finished product according to the alternative embodiments shown referring to FIGS. 15A-15C.
Figure 16B:
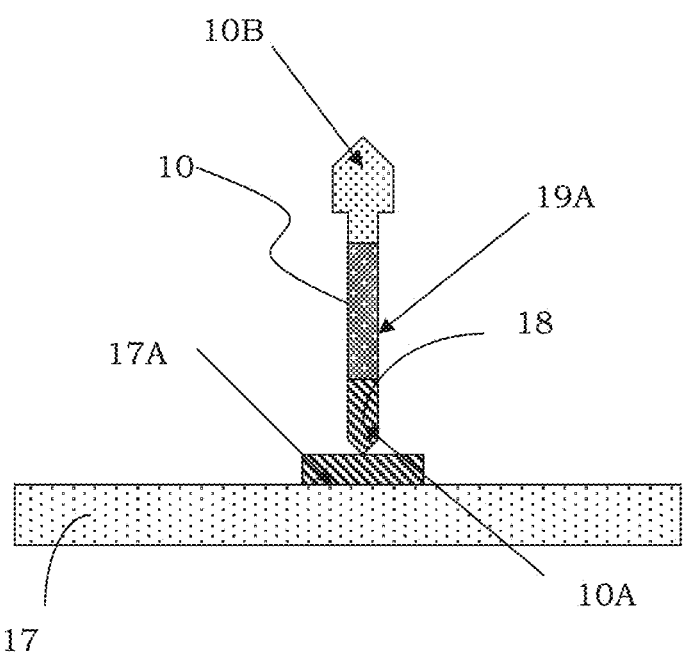
Figure 16C:
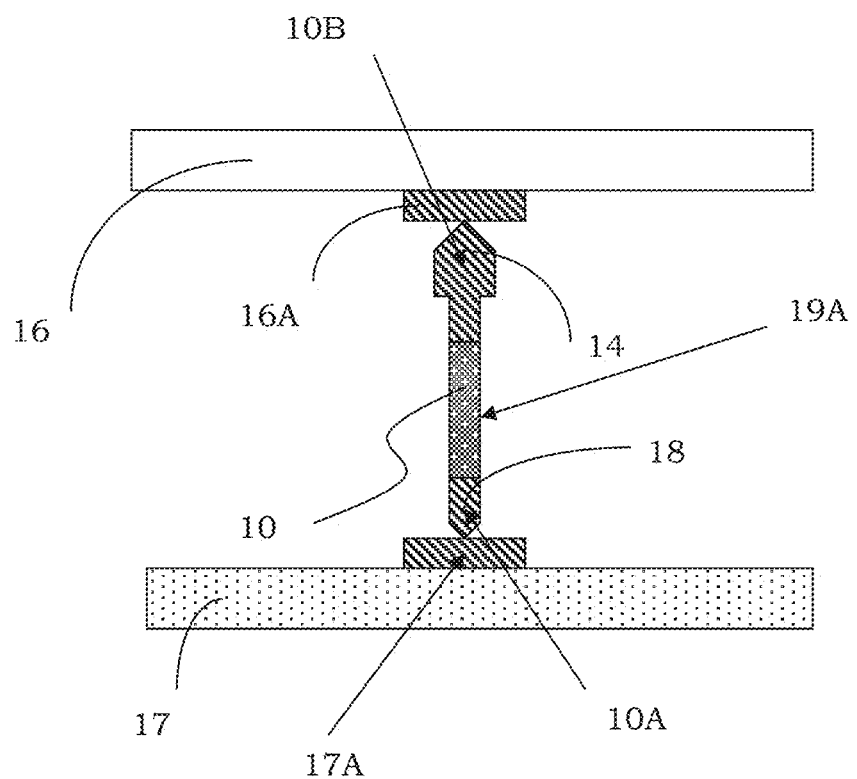

Following the separation step, in that case a plurality of contact probes 10 is obtained, each probe having one or both the end portions coated by the coating material and adjacent to the central portion 19A coated by the covering material 19, as schematically shown in FIGS. 16A-16C.

In conclusion, the present disclosure provides a semi-finished product 15 comprising a plurality of contact probes 10 for a testing head, each of those contact probes 10 being realized in a substrate 11 of a conductive material and being anchored to the substrate 11 by at least one material bridge 13.

The semi-finished product according to the disclosure allows carrying out coating and/or covering operations of the contact probes realized therein as a whole, thanks to the anchoring of the probes in the laminate from which they have been obtained, beginning to separate the contact probes from the laminate only at the end of the whole manufacturing process.

Advantageously, that semi-finished product is obtained by means of a method including at least one defining step of a plurality of contact probes being defined by removing material from a substrate, which probes can be of any shape, identical or different from each other, each contact probe being provided with at least one material bridge. That defining step is carried out in an extremely efficient way by laser cutting, which has reduced dimensional constraints and high precision levels, which characteristics make it particularly advantageous considering the involved dimensions, for both probes and material bridges. That defining step also allows defining the weakening lines of the material bridges, in particular by thinning the thickness of those material bridges at those lines in the direction orthogonal to the plane of the semi-finished product.

Suitably, the coating steps of the manufacturing method of the semi-finished product according to the disclosure also allow reducing to a minimum the supply of required coating material, when realized both by immersion in coating material in liquid phase and by vaporization of the coating material in vapor phase, with clear advantageous consequences on the final cost of the semi-finished product and of the contact probes so obtained, those coating materials being however very expensive.

It is also possible to cover the semi-finished product with a covering film, in particular a dielectric one, able to work as a "stopper" also for a following coating step, in particular with a conductive coating film, which is particularly advantageous in case of conductors made of noble metals, or however in case of very expensive materials.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing method of a semi-finished product comprising a plurality of contact probes for a testing head of electronic devices, the method comprising the steps of:
    providing a substrate made of a conductive material; and
    defining the contact probes by removing material from the substrate, the defining including:
        defining a plurality of frames in the substrate;
        defining the contact probes inside the frames, respectively; and
        defining a plurality of bridges respectively anchoring the respective contact probes to the respective frames of the substrate,
        the step of defining the contact probes comprising a step of laser cutting, in correspondence with a contour of the contact probes, frames, and bridges.

2. The manufacturing method of claim 1, wherein the step of defining the contact probes comprises the steps of:
    photolithographic etching the substrate by a masking process; and
    subsequent chemical etching the substrate.

3. The manufacturing method of claim 2, wherein the step of subsequent chemical etching the substrate comprises one or more steps of masking and etching the substrate.

4. The manufacturing method of claim 2, wherein the step of subsequent chemical etching the substrate comprises a step of selective chemical etching the substrate.

5. The manufacturing method of claim 1, wherein the step of defining the plurality of bridges includes definite respective pluralities of bridges, each plurality of bridges anchoring a corresponding one of the contact probes to the respective frame, the bridges in each plurality of bridges being positioned in a totally random manner, symmetrically or asymmetrically, along the corresponding one of the contact probes.

6. The manufacturing method of claim 1, wherein defining the plurality of bridges includes defining at least one first bridge of material positioned in a central position of a corresponding one of the contact probes and one second bridge of material positioned in a lateral position of the corresponding one of the contact probes.

7. The manufacturing method of claim 1, wherein defining the plurality of bridges further comprises equipping each bridge with at least one line of weakening passing through the bridge and adapted to facilitate separation of the contact probe from the substrate with breakage of the integrity of the material of the bridge, the line of weakening being obtained by a local thinning of the substrate, according to a direction orthogonal to a plane of the semi-finished product.

8. The manufacturing method of claim 1, wherein the step of providing the substrate comprises providing a monolayer made of a conductive material.

9. The manufacturing method of claim 1, wherein the step of providing the substrate comprises providing a multilayer, comprising a central layer or core made of a first conductive material covered by one or more coating layers made of a conductive material and apt to improve electro-mechanical performances and performances in terms of hardness of the contact probes.

10. The manufacturing method of claim 1, comprising at least one processing step, involving all contact probes included in the semi-finished product, in turn including one or more steps selected from a coating step, a covering step, a laser, photolithographic or electrochemical definition step, an electroplating step, an electrogalvanic deposition step, a micromechanical processing step, a sputtering step, a chemical or physical etching step.

11. The manufacturing method of claim 10, wherein the processing step affects at least one portion of the contact probes or the contact probes as a whole.

12. The manufacturing method of claim 10, wherein the processing step comprises multiple repeated steps of a same type for the same or different portions of the semi-finished product.

13. The manufacturing method of claim 10, wherein the processing step comprises at least one coating step of the semi-finished product and thus of the contact probes or portions thereof with realization of a coating film made of a coating material selected from a conductive material and a dielectric material.

14. The manufacturing method of claim 13, wherein the coating step realizes the coating film on at least one coated portion of the semi-finished product, the at least one coated portion being at an end portion of the semi-finished product, namely a portion comprising contact tips or contact heads of the contact probes realized in the semi-finished product.

15. The manufacturing method of claim 13, wherein the coating step realizes the coating film on at least one coated portion of the semi-finished product, the at least one coated portion being at a central portion of the semi-finished product, namely a portion not comprising contact tips nor contact heads of the contact probes realized in the semi-finished product.

16. The manufacturing method of claim 13, wherein the coating step realizes the coating film on at least one coated portion of the semi-finished product, the at least one coated portion being at an end portion of the semi-finished product, namely a portion comprising contact tips or contact heads of the contact probes realized in the semi-finished product and at a central portion of the semi-finished product, namely a portion not comprising contact tips nor contact heads of the contact probes realized in the semi-finished product.

17. The manufacturing method of claim 13, wherein the coating step realizes the coating film of a conductive material made of a metal or a metal alloy selected from palladium or alloys thereof, such as nickel-palladium, copper and alloys thereof, or made of graphene, or yet made of doped DLC (Diamond Like Carbon).

18. The manufacturing method of claim 13, wherein the coating step realizes the coating film of a dielectric material selected from fluorinated polymers, poly(p-xylylene) polymers, copolymers thereof or nanocomposites or non-doped DLC (Diamond like Carbon).

19. The manufacturing method of claim 13, wherein the coating step comprises an immersion of the semi-finished product in a coating material in liquid phase in a tank of an immersion bath, the coating material in liquid phase filling the tank up to a coating level adapted to determine a portion of the semi-finished product coated by the coating film.

20. The manufacturing method of claim 13, wherein the coating step comprises an insertion of the semi-finished product in a vaporization chamber, equipped with one or more nozzles adapted to spray a coating material in vapor phase in correspondence of at least one portion of the semi-finished product to be coated by the coating film.

21. The manufacturing method of claim 13, wherein the coating step comprises one or more steps of material deposition realized by a cathode sputtering process, wherein atoms, ions or molecular fragments are emitted by a solid material, called target, when bombarded with a beam of energetic particles and then recondense on the surfaces of the semi-finished product, and therefore on the whole or part of the extension of the contact probes made therein, when the semi-finished product is placed in a special vacuum chamber together with the target coating material suitably bombarded.

22. The manufacturing method of claim 1, further comprising a covering step by a dielectric covering material of at least one portion of the semi-finished product realizing at least one covering film in a portion of the semi-finished product.

23. A semi-finished product comprising:
a plurality of frames in a substrate of a conductive material;
a plurality of contact probes for a testing head, each contact probe being realized in the substrates; and
a plurality of bridges respectively anchoring the respective contact probes to the respective frames of the substrate, the contact probes and the bridges being realized by laser cutting the substrate in correspondence with a contour thereof.

24. The semi-finished product of claim 23, wherein the contact probes are anchored to the substrate by respective pluralities of bridges of material, the bridges in each plurality of bridges being positioned in a totally random manner, symmetrically or asymmetrically, along a corresponding one of the contact probes.

25. The semi-finished product of claim 23, wherein for each contact probe, a first bridge of material is positioned in a central position of the contact probe and a second bridge of material is positioned in a lateral position of the contact probe.

26. The semi-finished product of claim 23, wherein each bridge of material comprises at least one line of weakening passing through it and adapted to facilitate the separation of the respective contact probe from the substrate with breakage of the integrity of the bridge of material, the line of weakening being obtained by a local thinning of the substrate, according to a direction orthogonal to a plane of the semi-finished product.

27. The semi-finished product of claim 23, wherein the substrate comprises a monolayer made of a conductive material.

28. The semi-finished product of claim 23, wherein the substrate comprises a multilayer, comprising a central layer or core made of a first conductive material covered by one or more coating layers made of a conductive material and apt to improve electro-mechanical performances and performances in terms of hardness of the contact probes realized in the substrate.

29. The semi-finished product of claim 23, further comprising a coating film made of a coating material selected from a conductive material and a dielectric material and covering the contact probes or portions thereof.

30. The semi-finished product of claim 29, wherein the coating film covers at least one coated portion being at an end portion of the semi-finished product, namely a portion comprising contact tips or contact heads of the contact probes realized in the semi-finished product.

31. The semi-finished product of claim 29, wherein the coating film covers at least one coated portion of the semi-finished product being at a central portion of the semi-finished product, namely a portion not comprising contact tips nor contact heads of the contact probes realized in the semi-finished product.

32. The semi-finished product of claim 29, wherein the coating film covers least one coated portion being at an end portion of the semi-finished product, meaning a portion comprising contact tips or contact heads of the contact probes realized in the semi-finished product and at a central portion of the semi-finished product, namely a portion not comprising contact tips nor contact heads of the contact probes realized in the semi-finished product.

33. The semi-finished product of claim 29, wherein the coating film is made of a conductive material made of a metal or a metal alloy selected from palladium or alloys thereof, or made of graphene, or yet made of doped DLC (Diamond Like Carbon).

34. The semi-finished product of claim 29, wherein the coating film is made of a dielectric material selected from fluorinated polymers, poly(p-xylylene) polymers, copolymers thereof or nanocomposites or non-doped DLC (Diamond like Carbon).

35. A manufacturing method of a semi-finished product comprising a plurality of contact probes for a testing head of electronic devices, the method comprising the steps of:
providing a substrate made of a conductive material;
defining a plurality of frames in the substrate;
defining each contact probe inside a respective frame of the plurality of frames by removing material from the substrate
defining a plurality of bridges respectively anchoring the respective contact to the respective frames of the substrate,
the step of defining the contact probes comprising a step of laser cutting, in correspondence with a contour of the contact probes and of the at least one bridge of material.

* * * * *